(12) United States Patent
Nirschl et al.

(10) Patent No.: US 7,436,695 B2
(45) Date of Patent: Oct. 14, 2008

(54) RESISTIVE MEMORY INCLUDING BIPOLAR TRANSISTOR ACCESS DEVICES

(75) Inventors: Thomas Nirschl, Essex Junction, VT (US); Thomas Happ, Tarrytown, NY (US); Klaus Aufinger, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/602,720

(22) Filed: Nov. 21, 2006

(65) Prior Publication Data

US 2008/0117667 A1 May 22, 2008

(51) Int. Cl.
*G11C 11/00* (2006.01)
(52) U.S. Cl. ........................ 365/148; 365/158
(58) Field of Classification Search .......... 365/148, 365/158
See application file for complete search history.

(56) References Cited

U.S. PATENT DOCUMENTS 7,050,328 B2 * 5/2006 Khouri et al. ............... 365/163

2005/0099211 A1 * 5/2005 Dahlin ....................... 327/103
2005/0105329 A1 * 5/2005 Nazarian .................... 365/158
2006/0131693 A1 * 6/2006 Kim .......................... 257/565
2006/0145135 A1    7/2006 Huang et al.

OTHER PUBLICATIONS

"Multi-layer Cross-Point Binary Oxide Resistive Memory (OxRRAM) for Post-NAND Storage Application". I. G. Baek, et al. Samsung Advanced Institute of Technology. 2005. (4 pgs.).

* cited by examiner

*Primary Examiner*—Michael T Tran
(74) *Attorney, Agent, or Firm*—Dicke, Billig & Czaja, PLLC

(57) ABSTRACT

A memory includes a first bipolar transistor, a first bit line, and a first resistive memory element coupled between a collector of the first bipolar transistor and the first bit line. The memory includes a second bit line, a second resistive memory element coupled between an emitter of the first bipolar transistor and the second bit line, and a word line coupled to a base of the first bipolar transistor.

35 Claims, 18 Drawing Sheets

RESISTIVE MEMORY INCLUDING BIPOLAR TRANSISTOR ACCESS DEVICES

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of the memory. Increasing the density of a phase change memory increases the amount of data that can be stored within the memory while at the same time typically reducing the cost of the memory.

For these and other reasons, there is a need for the present invention.

SUMMARY

One embodiment of the present invention provides a memory. The memory includes a first bipolar transistor, a first bit line, and a first resistive memory element coupled between a collector of the first bipolar transistor and the first bit line. The memory includes a second bit line, a second resistive memory element coupled between an emitter of the first bipolar transistor and the second bit line, and a word line coupled to a base of the first bipolar transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
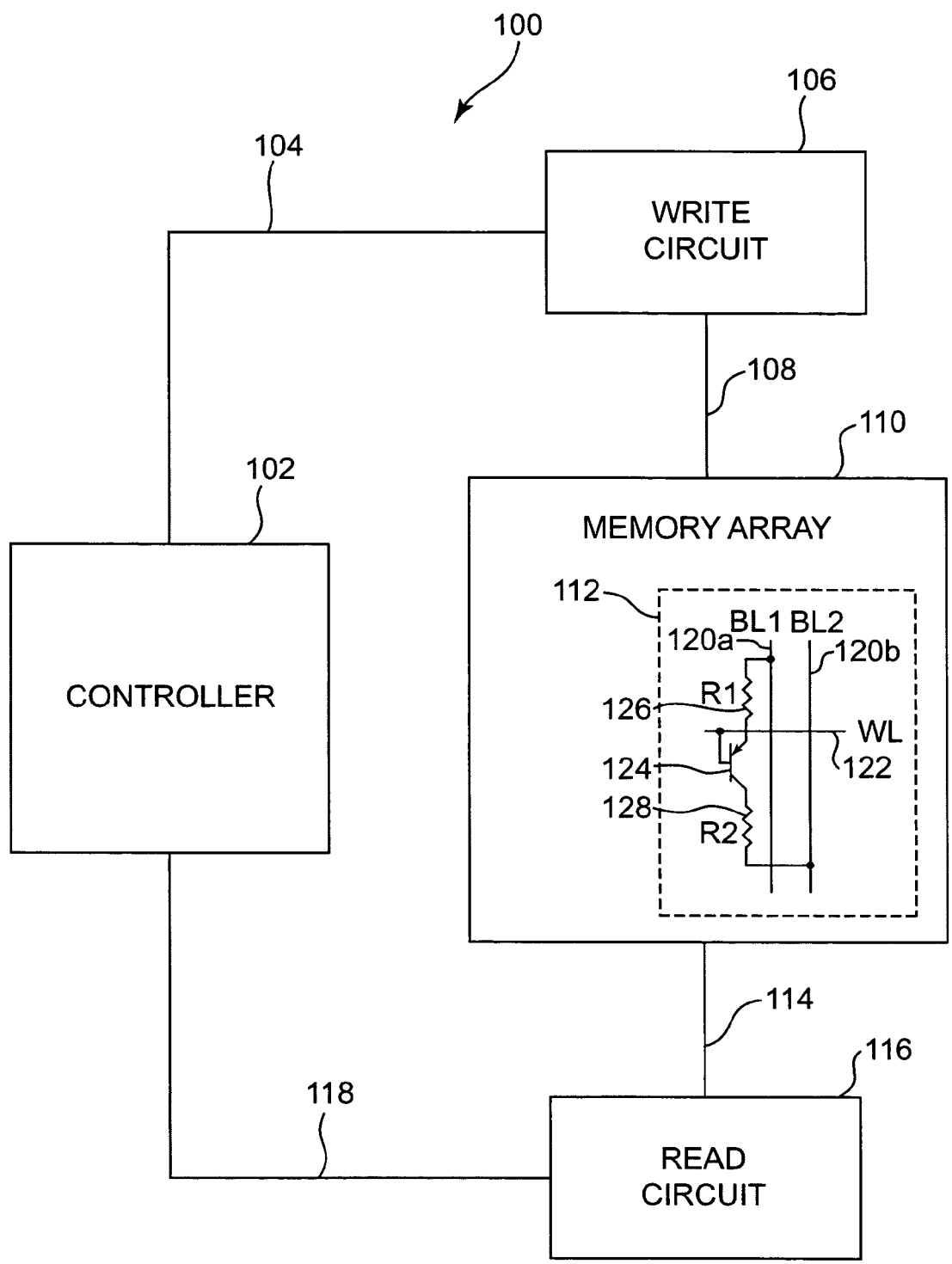
FIG. 1 is a block diagram illustrating one embodiment of a memory device.

FIG. 1 is a block diagram illustrating one embodiment of a memory device 100. Memory device 100 includes a controller 102, a write circuit 106, a memory array 110, and a read circuit 116. Memory array 110 includes a memory array portion 112. Memory array portion 112 includes a first bit line (BL1) 120a, a second bit line (BL2) 120b, a word line (WL) 122, a bipolar transistor 124, a first phase change element (R1) 126, and a second phase change element (R2) 128. First phase change element 126 and second phase change element 128 store data based on the amorphous and crystalline states of phase change material in the phase change element. The remainder of memory array 110 (not shown) is similar to memory array portion 112.

In one embodiment, first phase change element 126 and second phase change element 128 can each be programmed into one of two states by programming the phase change material to one of the amorphous and crystalline states. In another embodiment, first phase change element 126 and second phase change element 128 can each be programmed into one of three or more state by programming the phase change material to have intermediate resistance values. To program first phase change element 126 or second phase change element 128 to an intermediate resistance value, the amount of crystalline material coexisting with amorphous material, and hence the phase change element resistance, is controlled using a suitable write strategy.

Both first phase change element 126 and second phase change element 128 are accessed by bipolar transistor 124 for read and write access. First phase change element 126 is independently programmed and read without affecting the resistance state of second phase change element 128. Likewise, second phase change element 128 is independently programmed and read without affecting the resistance state of first phase change element 126.

As used herein, the term "electrically coupled" is not meant to mean that the elements must be directly coupled together and intervening elements may be provided between the "electrically coupled" elements.

Controller 102 is electrically coupled to write circuit 106 through signal path 104 and to read circuit 116 through signal path 118. Write circuit 106 is electrically coupled to memory array 110 though signal path 108. Memory array 110 is electrically coupled to read circuit 116 through signal path 114. First bit line 120a is electrically coupled to one side of first phase change element 126. The other side of first phase change element 126 is electrically coupled to the emitter of bipolar transistor 124. The base of bipolar transistor 124 is electrically coupled to word line 122. The collector of bipolar transistor 124 is electrically coupled to one side of second phase change element 128. The other side of phase change element 128 is electrically coupled to second bit line 120b. In another embodiment, first phase change element 126 is electrically coupled to the collector of bipolar transistor 124 and second phase change element 128 is electrically coupled to the emitter of bipolar transistor 124. While in the illustrated embodiment bipolar transistor 124 is a pnp transistor, in other embodiments bipolar transistor 124 is an npn transistor.

In one embodiment, first phase change element 126 and second phase change element 128 each include a phase change material that may be changed from an amorphous state to a crystalline state or from a crystalline state to an amorphous state under the influence of temperature change. The amount of crystalline phase change material coexisting with amorphous phase change material in each of first phase change element 126 and second phase change element 128 thereby defines two or more states for storing data within memory array 110.

In the amorphous state, a phase change material exhibits significantly higher resistivity than in the crystalline state. Therefore, the two or more states of first phase change element 126 and second phase change element 128 differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states, wherein the four states are assigned bit values of "00", "01", "10", and "11". In other embodiments, first phase change element 126 and second phase change element 128 can include any suitable number of states.

The phase change material of first phase change element 126 and second phase change element 128 may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Controller 102 includes a microprocessor, microcontroller, or other suitable logic circuitry for controlling the operation of memory circuit 100. Controller 102 controls read and write operations of memory circuit 100 including the application of control and data signals to memory array 110 through write circuit 106 and read circuit 116.

Write circuit 106 provides voltage and/or current pulses through signal path 108 to word line 122 and bit lines 120a and 120b to program first phase change element 126 and second phase change element 128. To program first phase change element 126, write circuit 106 generates a bias voltage between first bit line 120a and word line 122 to generate a write current through first phase change element 126 capable of programming first phase change element 126. At the same time, write circuit 106 maintains no bias voltage between second bit line 120b and word line 122 such that a current is not generated through second phase change element 128 that is capable of programming second phase change element 128. To program second phase change element 128, write circuit 106 generates a bias voltage between second bit line 120b and word line 122 to generate a write current through second phase change element 128 capable of programming second phase change element 128. At the same time, write circuit 106 maintains no bias voltage between first bit line 120a and word line 122 such that a current is not generated through first phase change element 126 that is capable of programming first phase change element 126.

The write current generated through first phase change element 126 or second phase change element 128 during a write operation heats the phase change material in the target phase change element. The current pulse amplitude and duration is controlled depending on whether the phase change element is being set or reset. Generally, a "set" operation of a phase change element is heating the phase change material of the target phase change element above its crystallization temperature (but below its melting temperature) long enough to achieve the crystalline state or a partially crystalline and partially amorphous state. Generally, a "reset" operation of a phase change element is heating the phase change material of the target phase change element above its melting temperature, and then quickly quench cooling the material, thereby achieving the amorphous state or a partially amorphous and partially crystalline state.

Read circuit 116 reads each of the two or more states of first phase change element 126 and second phase change element 128 through signal path 114. To read the resistance state of one of first phase change element 126 and second phase change element 128, read circuit 116 provides voltage pulses on word line 122 and bit lines 120a and 120b and reads the current on bit lines 120a and 120b. To read the resistance state of first phase change element 126, read circuit 116 generates a bias voltage between first bit line 120a and word line 122 to generate a current through first phase change element 126 indicating the resistance state of first phase change element 126. At the same time, read circuit 116 maintains no bias voltage between second bit line 120b and word line 122 such that a current is not generated through second phase change element 128 that is capable of disturbing the resistance state of second phase change element 128. To read the resistance state of second phase change element 128, read circuit 116 generates a bias voltage between second bit line 120b and word line 122 to generate a current through second phase change element 128 indicating the resistance state of second phase change element 128. At the same time, read circuit 116 maintains no bias voltage between first bit line 120a and word line 122 such that a current is not generated through first phase change element 126 that is capable of disturbing the resistance state of first phase change element 126.

Figure 2A:
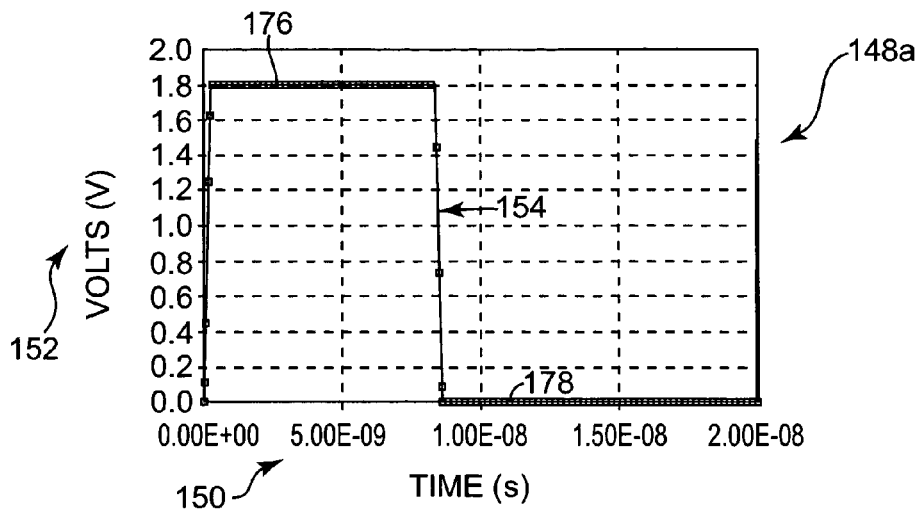
FIG. 2A is a graph illustrating one embodiment of a voltage signal applied to a first bit line of a memory array for a read operation.
Figure 2B:
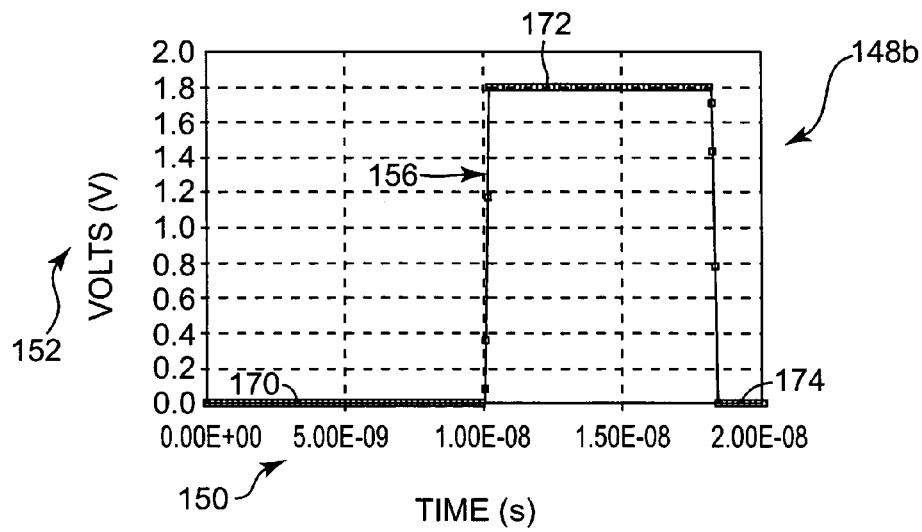
FIG. 2B is a graph illustrating one embodiment of a voltage signal applied to a second bit line of a memory array for a read operation.
Figure 2C:
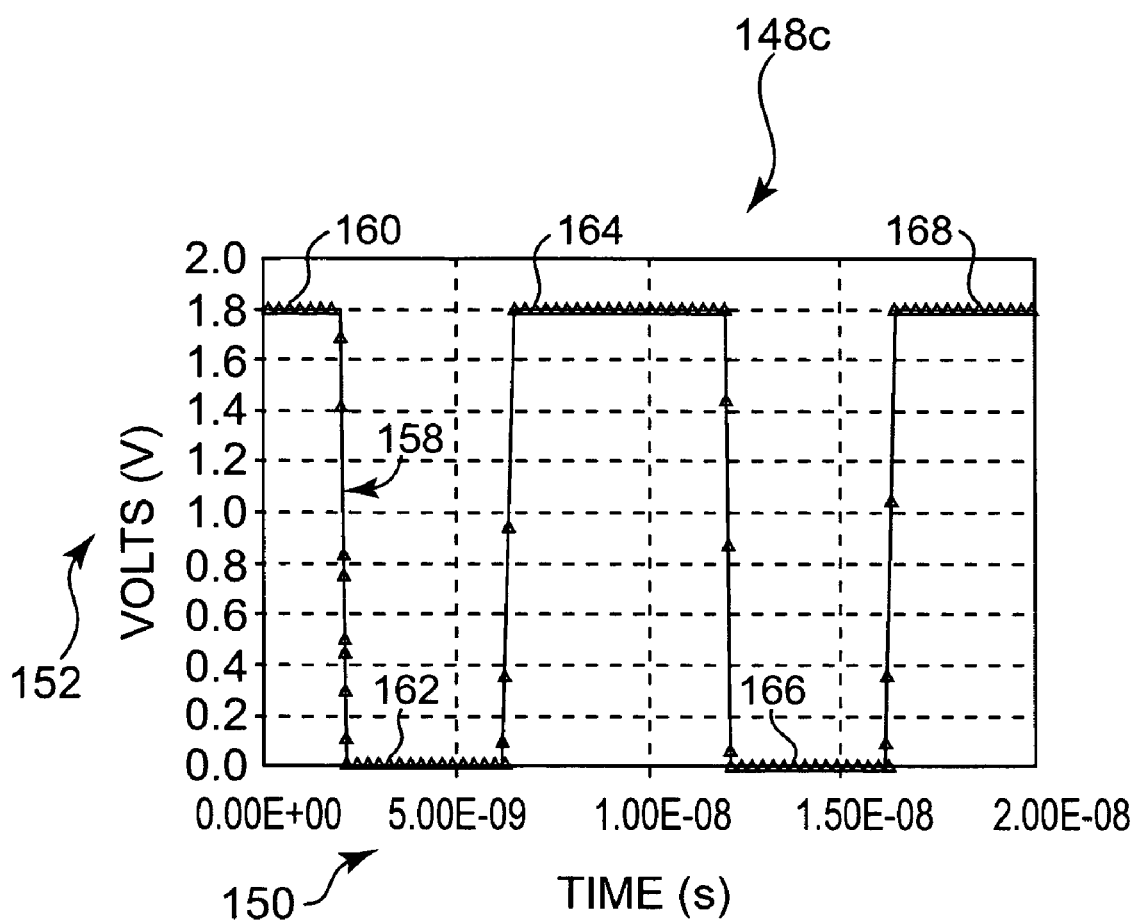
FIG. 2C is a graph illustrating one embodiment of a voltage signal applied to a third bit line of a memory array for a read operation.

FIG. 2A is a graph 148a illustrating one embodiment of a voltage signal 154 applied to first bit line 120a of memory array 110 for a read operation. FIG. 2B is a graph 148b illustrating one embodiment of a voltage signal 156 applied to second bit line 120b of memory array 110 for the read operation. FIG. 2C is a graph 148c illustrating one embodiment of a voltage signal 158 applied to a third bit line (not shown in FIG. 1) of memory array 110 adjacent to second bit line 120b for the read operation. Each graph 148a-148c includes time in seconds (s) on x-axis 150 versus volts (V) on y-axis 152. Between 0 ns and 10 ns, the resistance state of first phase change element 126 is sensed. Between 10 ns and 20 ns, the resistance state of second phase change element 128 is sensed. By properly biasing bipolar transistor 124, the resistance state of one of first phase change element 126 and second phase change element 128 can be sensed without affecting the resistance state of the other of first phase change element 126 and second phase change element 128.

FIG. 2A illustrates voltage signal 154 applied to first bit line 120a during a read operation. At 0 ns, voltage signal 154 transitions from 0V to 1.8V. Between approximately 0 ns and 8 ns, voltage signal 154 is maintained at 1.8V as indicated at 176. At approximately 8 ns, voltage signal 154 transitions back to 0V where the voltage signal is maintained as indicated at 178.

FIG. 2B illustrates voltage signal 156 applied to second bit line 120b during the read operation. Between approximately 0 ns and 10 ns, voltage signal 156 is maintained at 0V as indicated at 170. At approximately 10 ns, voltage signal 156 transitions to 1.8V where the voltage signal is maintained as indicated at 172. Voltage signal 156 transitions back to 0V at approximately 18 ns where the voltage signal is maintained as indicated at 174. In one embodiment, word line 122 and second bit line 120b are biased to different values during read and write operations where the voltage applied to second bit line 120b and/or word line 122 is not constant for the complete cycle but rather changes as a function of time or any other measured resistance value.

FIG. 2C illustrates voltage signal 158 applied to a third bit line adjacent to second bit line 120b. Between approximately 0 ns and 2.5 ns, voltage signal 154 is maintained at 1.8V as indicated at 160. Voltage signal 158 transitions from 1.8V to 0V at approximately 2.5 ns where the voltage signal is maintained as indicated at 162. At approximately 6.5 ns, voltage signal 158 transitions back to 1.8V where the voltage signal is maintained as indicated at 164. Voltage signal 158 transitions back to 0V at approximately 12.5 ns where the voltage signal is maintained as indicated at 166. At approximately 16.5 ns, voltage signal 158 transitions back to 1.8V where the voltage signal is maintained as indicated at 168.

Figure 3A:
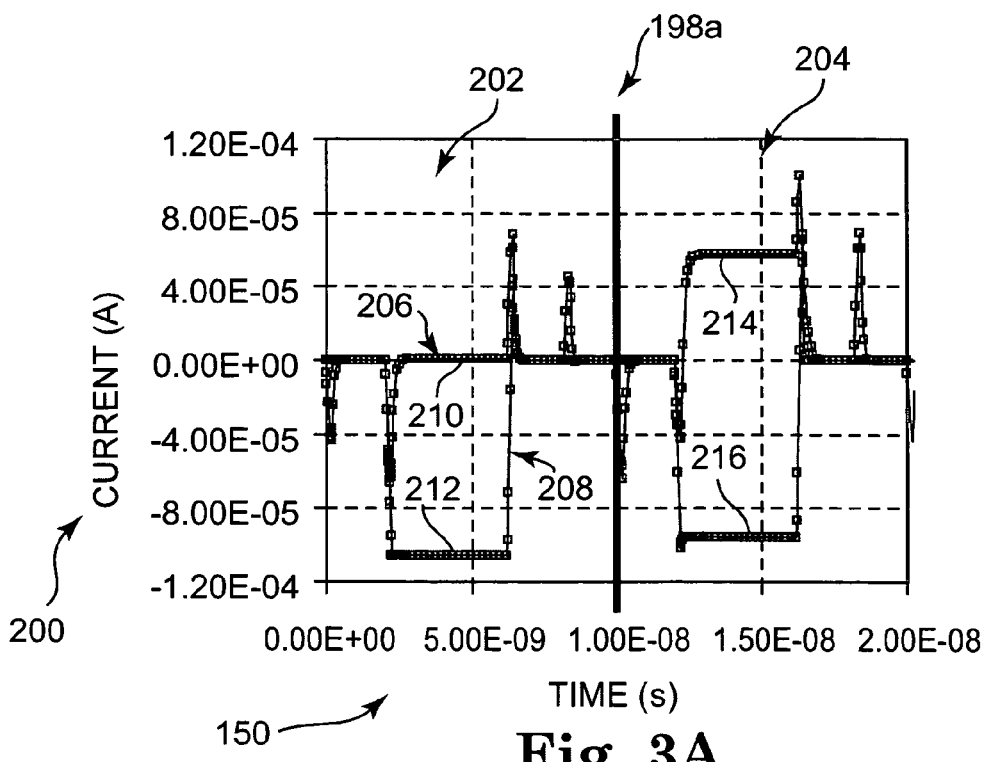
FIG. 3A is a graph illustrating one embodiment of read signals from two phase change elements in response to a read operation.
Figure 3B:
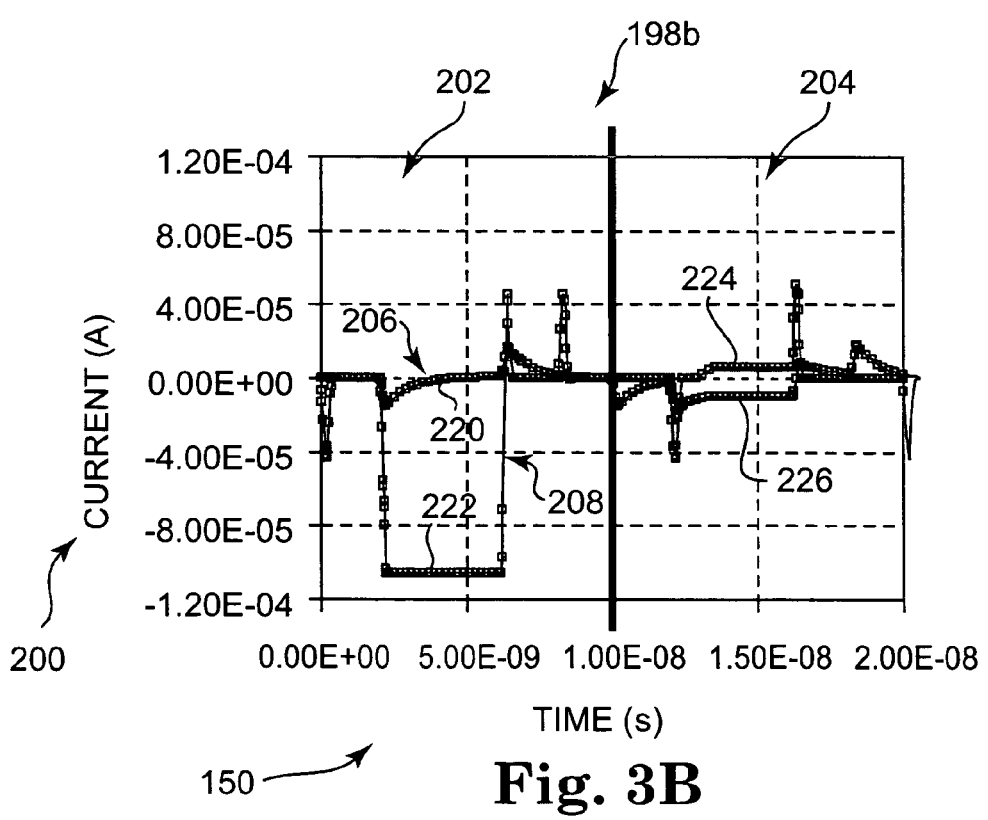
FIG. 3B is a graph illustrating another embodiment of read signals from two phase change elements in response to a read operation.
Figure 3C:
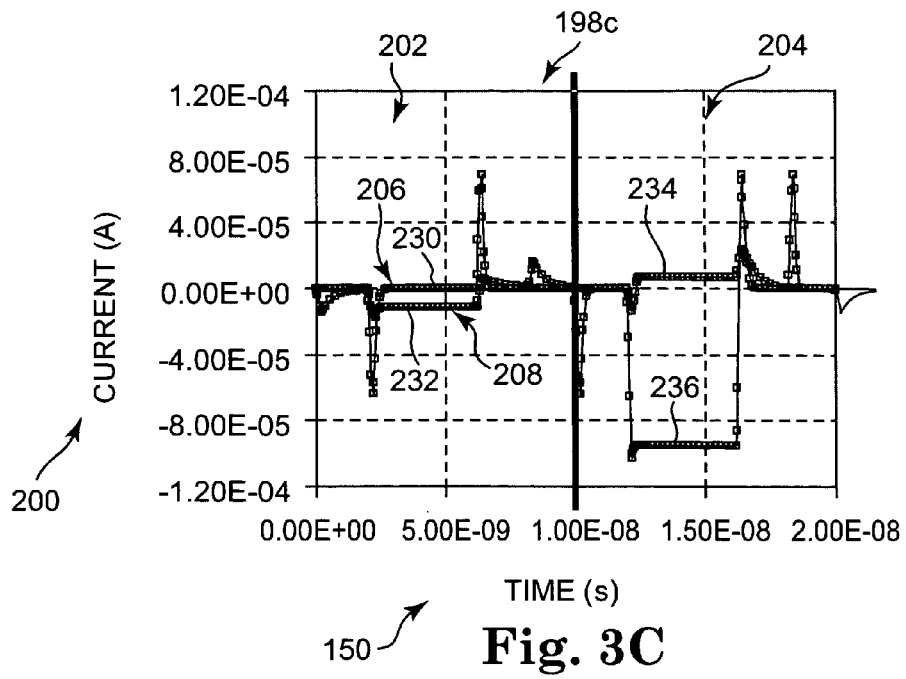
FIG. 3C is a graph illustrating another embodiment of read signals from two phase change elements in response to a read operation.
Figure 3D:
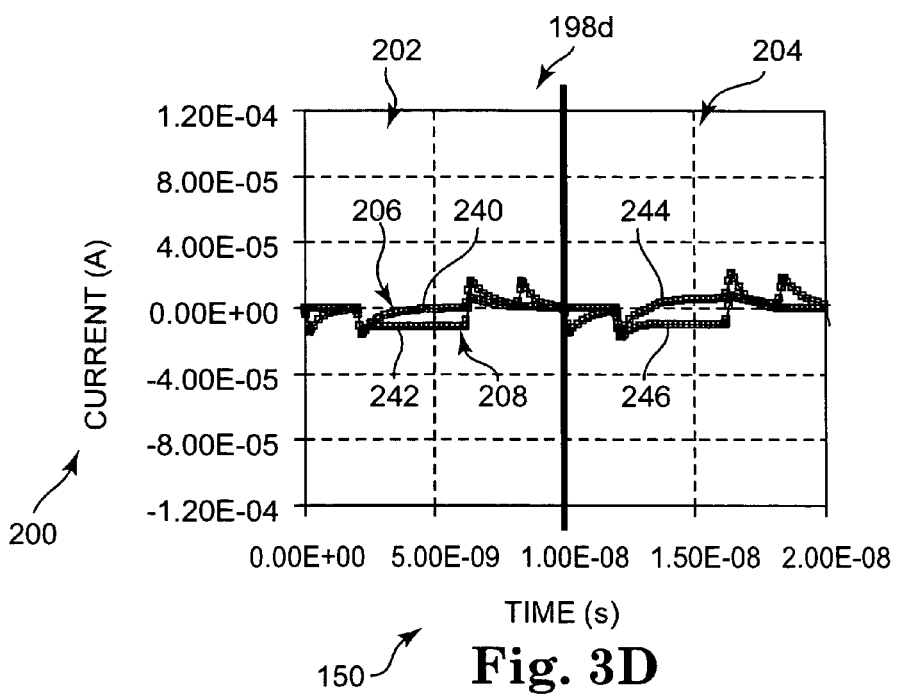
FIG. 3D is a graph illustrating another embodiment of read signals from two phase change elements in response to a read operation.

FIG. 3A is a graph 198a illustrating one embodiment of read signals from first phase change element 126 and second phase change element 128 in response to the read operation. FIG. 3B is a graph 198b illustrating another embodiment of read signals from first phase change element 126 and second phase change element 128 in response to the read operation. FIG. 3C is a graph 198c illustrating another embodiment of read signals from first phase change element 126 and second phase change element 128 in response to the read operation. FIG. 3D is a graph 198d illustrating another embodiment of read signals from first phase change element 126 and second phase change element 128 in response to the read operation.

Each graph 198a-198d includes time in seconds on x-axis 150 versus current in amps (A) on y-axis 200. For each graph 198a-198d, the resistance state of first phase change element 126 is sensed between 0 ns and 10 ns as indicated at 202. For each graph 198a-198d, the resistance state of second phase change element 128 is sensed between 10 ns and 20 ns as indicated at 204. Each graph 198a-198d includes current signal 208 on first bit line 120a and current signal 206 on second bit line 120b. Current signal 208 and current signal 206 are provided in response to voltage signals 154, 156, and 158 applied to the bit lines as previously described and illustrated with reference to FIGS. 2A-2C.

FIG. 3A illustrates current signal 208 in response to sensing a low resistance or "0" state of first phase change element 126 at 202 and current signal 206 in response to sensing a low resistance or "0" state of second phase change element 128 at 204. In response to voltage signal 154 at 176, voltage signal 156 at 170, and voltage signal 158 at 162, the current through first phase change element 126 is approximately −100 μA as indicated at 212 while the current through second phase change element 128 is 0 μA as indicated at 210. Read circuit 116 senses current signal 208 at 212. Based on the current signal, read circuit 116 determines that first phase change element 126 is programmed to the "0" state.

In response to voltage signal 154 at 178, voltage signal 156 at 172, and voltage signal 158 at 166, the current through second phase change element 128 is approximately −100 μA as indicated at 216 while the current through first phase change element 126 is approximately 60 μA as indicated at 214. Read circuit 116 senses current signal 206 at 216. Based on the current signal, read circuit 116 determines that second phase change element 120 is programmed to the "0" state. The current through first phase change element 126 at 214 is ignored and is not large enough to alter the resistance state of first phase change element 126.

FIG. 3B illustrates current signal 208 in response to sensing a low resistance or "0" state of first phase change element 126 at 202 and current signal 206 in response to sensing a high resistance or "1" state of second phase change element 128 at 204. In response to voltage signal 154 at 176, voltage signal 156 at 170, and voltage signal 158 at 162, the current through first phase change element 126 is approximately −100 μA as indicated at 222 while the current through second phase change element 128 is 0 μA as indicated at 220. Read circuit 116 senses current signal 208 at 222. Based on the current signal, read circuit 116 determines that first phase change element 126 is programmed to the "0" state.

In response to voltage signal 154 at 178, voltage signal 156 at 172, and voltage signal 158 at 166, the current through second phase change element 128 is approximately −1 μA as indicated at 226 while the current through first phase change element 126 is approximately 1 μA as indicated at 224. Read circuit 116 senses current signal 206 at 226. Based on the current signal, read circuit 116 determines that second phase change element 128 is programmed to the "1" state. The current through first phase change element 126 at 224 is ignored and is not large enough to alter the resistance state of first phase change element 126.

FIG. 3C illustrates current signal 208 in response to sensing a high resistance or "1" state of first phase change element 126 at 202 and current signal 206 in response to sensing a low resistance or "0" state of second phase change element 128 at 204. In response to voltage signal 154 at 176, voltage signal 156 at 170, and voltage signal 158 at 162, the current through first phase change element 126 is approximately −1 μA as indicated at 232 while the current through second phase change element 128 is 0 μA as indicated at 230. Read circuit 116 senses current signal 208 at 232. Based on the current signal, read circuit 116 determines that first phase change element 126 is programmed to the "1" state.

In response to voltage signal 154 at 178, voltage signal 156 at 172, and voltage signal 158 at 166, the current through second phase change element 128 is approximately −100 μA as indicated at 236 while the current through first phase change element 126 is approximately 1 μA as indicated at 234. Read circuit 116 senses current signal 206 at 236. Based on the current signal, read circuit 116 determines that second phase change element 128 is programmed to the "0" state. The current through first phase change element 126 at 234 is ignored and is not large enough to alter the resistance state of first phase change element 126.

FIG. 3D illustrates current signal 208 in response to sensing a high resistance or "1" state of first phase change element 126 at 202 and current signal 206 in response to sensing a high resistance or "1" state of second phase change element 128 at 204. In response to voltage signal 154 at 176, voltage signal 156 at 170, and voltage signal 158 at 162, the current through first phase change element 126 is approximately −1 μA as indicated at 242 while the current through second phase change element 128 is 0 μA as indicated at 240. Read circuit 116 senses current signal 208 at 242. Based on the current signal, read circuit 116 determines that first phase change element 126 is programmed to the "1" state.

In response to voltage signal 154 at 178, voltage signal 156 at 172, and voltage signal 158 at 166, the current through second phase change element 128 is approximately −1 μA as indicated at 246 while the current through first phase change element 126 is approximately 1 μA as indicated at 244. Read circuit 116 senses current signal 206 at 246. Based on the current signal, read circuit 116 determines that second phase change element 128 is programmed to the "1" state. The current through first phase change element 126 at 244 is ignored and is not large enough to alter the resistance state of first phase change element 126.

As illustrated in graphs 198a-198d, the difference in current sensed in response to a phase change element in a low resistance state and a phase change element in a high resistance state is approximately 9 μA. In addition, the current sensed from one of first phase change element 126 and second phase change element 128 for each resistance state is independent of the resistance state of the other of first phase change element 126 and second phase change element 128. In other embodiments, the specific voltages applied to the bit lines as illustrated in FIGS. 2A-2C and the specific currents sensed in response to the applied voltages as illustrated in FIGS. 3A-3D vary based on the specific memory array components and peripheral circuitry used. The specific current levels sensed also depend on the programmed state of the selected memory element. Embodiments of the present invention apply to both single bit and multi-bit memory elements.

Figure 4:
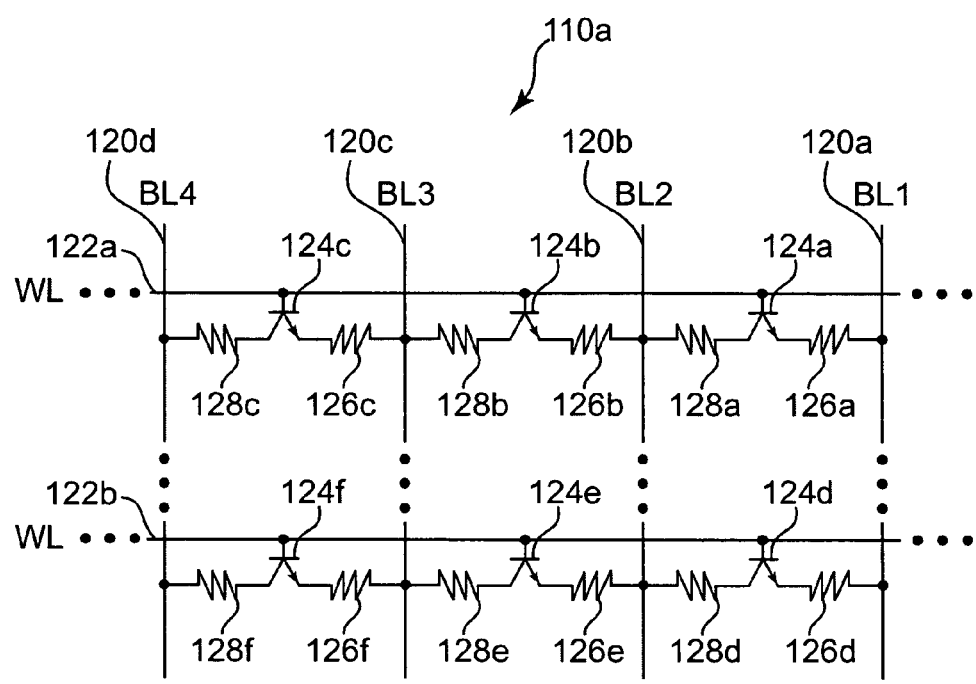
FIG. 4 is a schematic diagram illustrating one embodiment of a phase change memory array.

FIG. 4 is a schematic diagram illustrating one embodiment of a phase change memory array 110a. In one embodiment, memory array 110 is similar to phase change memory array 110a. Memory array 110a includes bit lines 120a-120d, word lines 122a-122b, bipolar transistors 124a-124f, first phase change elements 126a-126f, and second phase change elements 128a-128f. Each bit line 120 is electrically coupled to a plurality of first phase change elements 126 and to a plurality of second phase change elements 128. Each bipolar transistor 124 is electrically coupled to a first phase change element 126, a second phase change element 128, and a word line 122.

Bit line 120a is electrically coupled to one side of first phase change element 126a. The other side of first phase change element 126a is electrically coupled to the emitter of bipolar transistor 124a. The base of bipolar transistor 124a is electrically coupled to word line 122a. The collector of bipolar transistor of 124a is electrically coupled to one side of second phase change element 128a. The other side of second phase change element 128a is electrically coupled to bit line 120b.

Bit line 120b is electrically coupled to one side of first phase change element 126b. The other side of first phase change element 126b is electrically coupled to the emitter of bipolar transistor 124b. The base of bipolar transistor 124b is electrically coupled to word line 122a. The collector of bipolar transistor of 124b is electrically coupled to one side of second phase change element 128b. The other side of second phase change element 128b is electrically coupled to bit line 120c.

Bit line 120c is electrically coupled to one side of first phase change element 126c. The other side of first phase change element 126c is electrically coupled to the emitter of bipolar transistor 124c. The base of bipolar transistor 124c is electrically coupled to word line 122a. The collector of bipolar transistor of 124c is electrically coupled to one side of second phase change element 128c. The other side of second phase change element 128c is electrically coupled to bit line 120d.

Bit line 120a is electrically coupled to one side of first phase change element 126d. The other side of first phase change element 126d is electrically coupled to the emitter of bipolar transistor 124d. The base of bipolar transistor 124d is electrically coupled to word line 122b. The collector of bipolar transistor of 124d is electrically coupled to one side of second phase change element 128d. The other side of second phase change element 128d is electrically coupled to bit line 120b.

Bit line 120b is electrically coupled to one side of first phase change element 126e. The other side of first phase change element 126e is electrically coupled to the emitter of bipolar transistor 124e. The base of bipolar transistor 124e is electrically coupled to word line 122b. The collector of bipolar transistor of 124e is electrically coupled to one side of second phase change element 128e. The other side of second phase change element 128e is electrically coupled to bit line 120c.

Bit line 120c is electrically coupled to one side of first phase change element 126f. The other side of first phase change element 126f is electrically coupled to the emitter of bipolar transistor 124f. The base of bipolar transistor 124f is electrically coupled to word line 122b. The collector of bipolar transistor of 124f is electrically coupled to one side of second phase change element 128f. The other side of second phase change element 128f is electrically coupled to bit line 120d.

In another embodiment, each first phase change element 126 is electrically coupled to a collector of a bipolar transistor 124 and each second phase change element 128 is electrically coupled to an emitter of a bipolar transistor 124. While in the illustrated embodiment bipolar transistors 124 are npn transistors, in other embodiments bipolar transistors 124 are pnp transistors.

In this embodiment, each bipolar transistor 124 is used to access one first phase change element 126 and one second phase change element 128 as previously described and illustrated with reference to memory array portion 112 in FIG. 1. Phase change memory array 110a operates similarly to memory array 110.

Figure 5A:
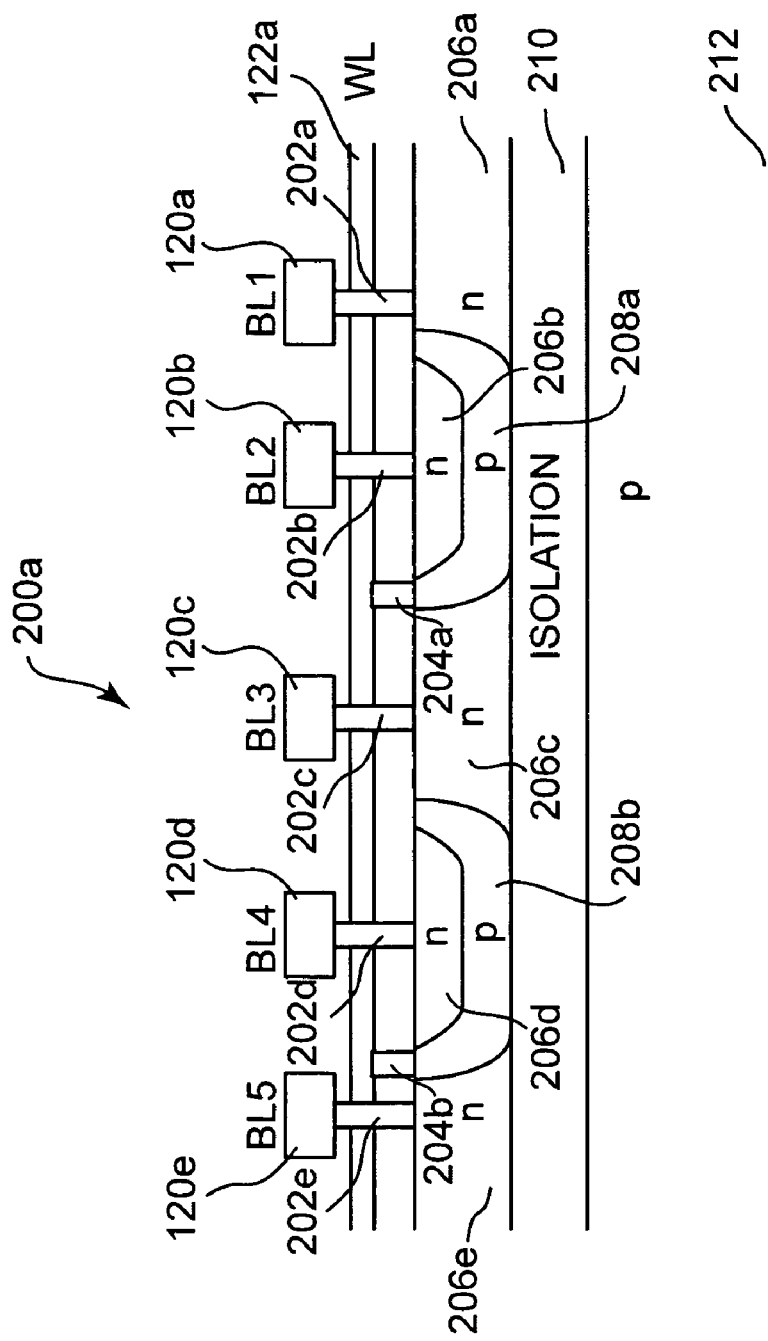
FIG. 5A is a simplified cross-sectional view illustrating one embodiment of the phase change memory array illustrated in FIG. 4.

FIG. 5A is a simplified cross-sectional view illustrating one embodiment 200a of phase change memory array 110a previously described and illustrated with reference to FIG. 4. Embodiment 200a includes bit lines 120a-120e, word line 122a, word line contacts 204a-204b, contacts and phase change elements 202a-202e, n-type collector/emitter regions 206a-206e of bipolar transistors 124, p-type base regions 208a-208b of bipolar transistors 124, isolation region 210, and p-type substrate 212. In this embodiment, each bipolar transistor 124 is an npn transistor and shares a common base region 208 with an adjacent bipolar transistor 124.

Bit line 120a is electrically coupled to contacts and phase change elements 202a. Contacts and phase change elements 202a include first phase change element 126a and a second phase change element 128. Contacts and phase change elements 202a are electrically coupled to collector/emitter region 206a. Bit line 120b is electrically coupled to contacts and phase change elements 202b. Contacts and phase change elements 202b include first phase change element 126b and second phase change element 128a. Contacts and phase change elements 202b are electrically coupled to collector/emitter region 206b. Word line 122a is electrically coupled to base region 208a through word line contact 204a. Collector/emitter regions 206a and 206b and base region 208a form bipolar transistor 124a.

Bit line 120c is electrically coupled to contacts and phase change elements 202c. Contacts and phase change elements 202c include first phase change element 126c and second phase change element 128b. Contacts and phase change elements 202c are electrically coupled to collector/emitter region 206c. Collector/emitter regions 206b and 206c and base region 208a form bipolar transistor 124b.

Bit line 120d is electrically coupled to contacts and phase change elements 202d. Contacts and phase change elements 202d include second phase change element 128c and a first phase change element 126. Contacts and phase change elements 202d are electrically coupled to collector/emitter region 206d. Word line 122a is electrically coupled to base region 208b through word line contact 204b. Collector/emitter regions 206c and 206d and base region 208b form bipolar transistor 124c.

Bit line 120e is electrically coupled to contacts and phase change elements 202e. Contacts and phase change elements 202e include a first phase change element 126 and a second phase change element 128. Contacts and phase change elements 202e are electrically coupled to collector/emitter region 206e. Collector/emitter regions 206d and 206e and base region 208b form a bipolar transistor 124.

Bit lines 120a-120e are formed above word line 122a. Collector/emitter region 206b is formed directly above and is surrounded by base region 208a. Collector/emitter region 206d is formed directly above and is surrounded by base region 208b. Collector/emitter region 206a is formed adjacent to base region 208a. Collector/emitter region 206c is formed adjacent to and between base region 208a and base region 208b. Collector/emitter region 206e is formed adjacent to base region 208b. In this embodiment, a silicon on insulator (SOI) fabrication technique is used. Isolation region 210 isolates collector/emitter regions 206a, 206c, and 206e from each other and from substrate 212. Isolation region 210 also isolates base regions 208a and 208b from each other and from substrate 212.

Figure 5B:
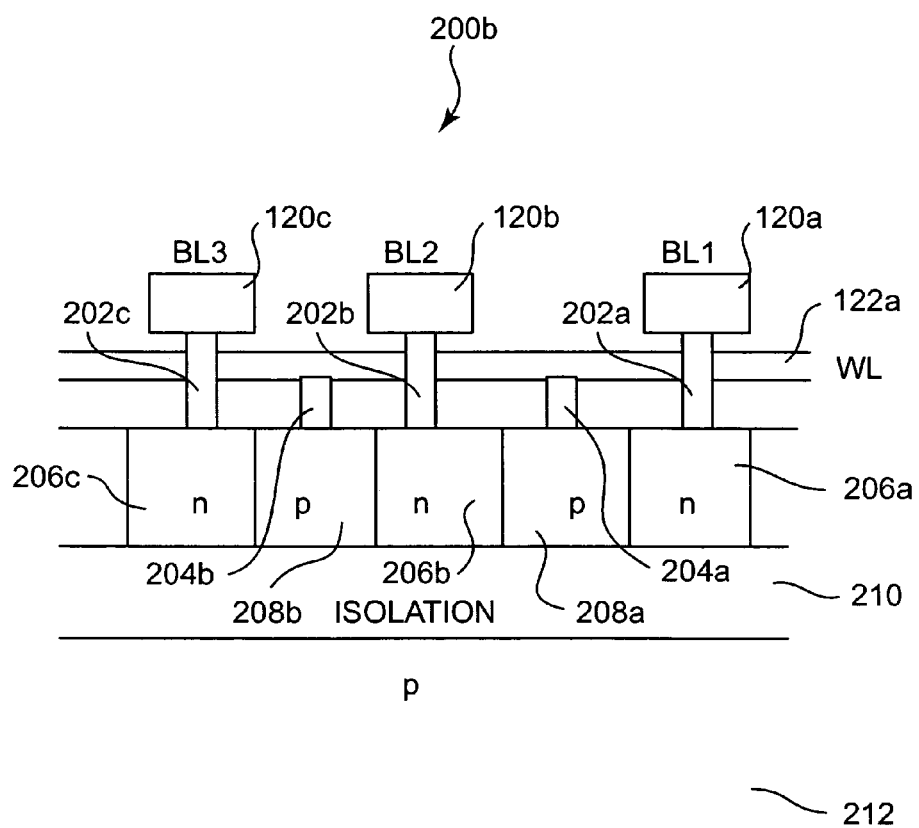
FIG. 5B is a simplified cross-sectional view illustrating another embodiment of the phase change memory array illustrated in FIG. 4.

FIG. 5B is a simplified cross-sectional view illustrating another embodiment 200b of phase change memory array 110a previously described and illustrated with reference to FIG. 4. Embodiment 200b includes bit lines 120a-120c, word line 122a, word line contacts 204a-204b, contacts and phase change elements 202a-202c, n-type collector/emitter regions 206a-206c of bipolar transistors 124, p-type base regions 208a-208b of bipolar transistors 124, isolation region 210, and p-type substrate 212. In this embodiment, each bipolar transistor 124 is an npn transistor.

Bit line 120a is electrically coupled to contacts and phase change elements 202a. Contacts and phase change elements 202a include first phase change element 126a and a second phase change element 128. Contacts and phase change elements 202a are electrically coupled to collector/emitter region 206a. Word line 122a is electrically coupled to base region 208a through word line contact 204a. Bit line 120b is electrically coupled to contacts and phase change elements 202b. Contacts and phase change elements 202b include first phase change element 126b and second phase change element 128a. Contacts and phase change elements 202b are electrically coupled to collector/emitter region 206b. Collector/emitter regions 206a and 206b and base region 208a form bipolar transistor 124a.

Word line 122a is electrically coupled to base region 208b through word line contact 204b. Bit line 120c is electrically coupled to contacts and phase change elements 202c. Contacts and phase change elements 202c include first phase change element 126c and second phase change element 128b. Contacts and phase change elements 202c are electrically coupled to collector/emitter region 206c. Collector/emitter regions 206b and 206c and base region 208b form bipolar transistor 124b.

Bit lines 120a-120c are formed above word line 122a. Each collector/emitter region 206 is formed adjacent to and between two base regions 208. For example, collector/emitter region 206b is formed adjacent to and between base region 208a and base region 208b. In this embodiment, a SOI fabrication technique is used. Isolation region 210 isolates collector/emitter regions 206a-206c from each other and from substrate 212. Isolation region 210 also isolates base regions 208a and 208b from each other and from substrate 212.

Figure 5C:
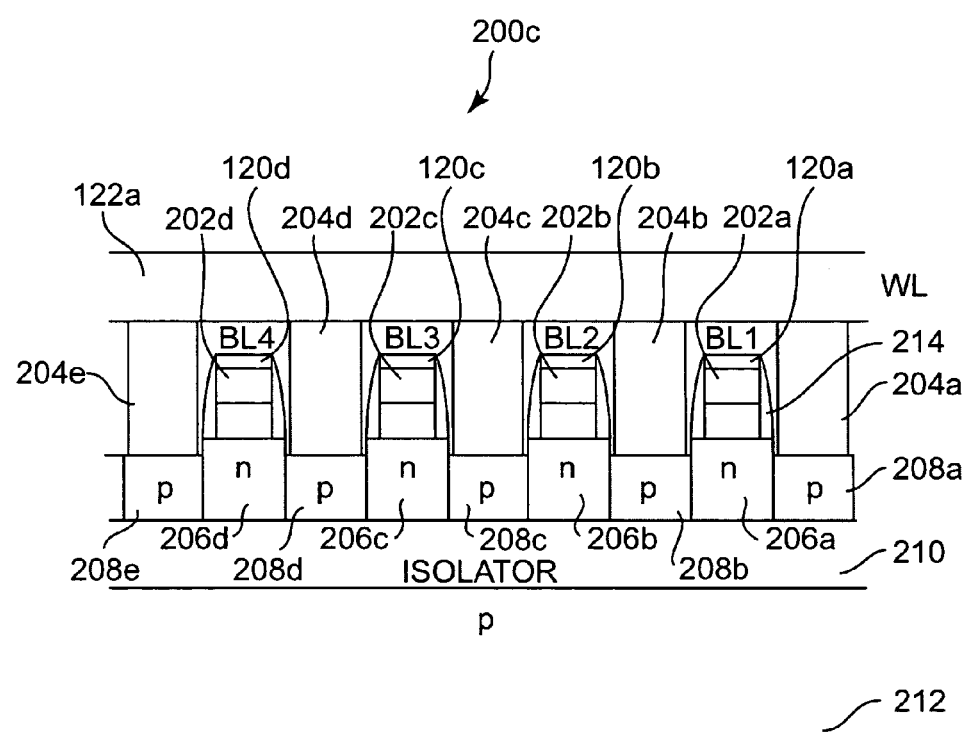
FIG. 5C is a simplified cross-sectional view illustrating another embodiment of the phase change memory array illustrated in FIG. 4.

FIG. 5C a simplified cross-sectional view illustrating another embodiment 200c of phase change memory array 110a previously described and illustrated with reference to FIG. 4. Embodiment 200c includes bit lines 120a-120d, word line 122a, word line contacts 204a-204e, contacts and phase change elements 202a-202d, n-type collector/emitter regions 206a-206d of bipolar transistors 124, p-type base regions 208a-208e of bipolar transistors 124, isolation region 210, dielectric material 214, and p-type substrate 212. In this embodiment, each bipolar transistor 124 is an npn transistor.

Word line 122a is electrically coupled to base region 208a through word line contact 204a. Bit line 120a is electrically coupled to contacts and phase change elements 202a. Contacts and phase change elements 202a include first phase change element 126a and a second phase change element 128. Contacts and phase change elements 202a are electrically coupled to collector/emitter region 206a. Word line 122a is electrically coupled to base region 208b through word line contact 204b. Bit line 120b is electrically coupled to contacts and phase change elements 202b. Contacts and phase change elements 202b include first phase change element 126b and second phase change element 128a. Contacts and phase change elements 202b are electrically coupled to collector/emitter region 206b. Collector/emitter regions 206a and 206b and base region 208b form bipolar transistor 124a.

Word line 122a is electrically coupled to base region 208c through word line contact 204c. Bit line 120c is electrically coupled to contacts and phase change elements 202c. Contacts and phase change elements 202c include first phase change element 126c and second phase change element 128b. Contacts and phase change elements 202c are electrically coupled to collector/emitter region 206c. Collector/emitter regions 206b and 206c and base region 208c form bipolar transistor 124b.

Word line 122a is electrically coupled to base region 208d through word line contact 204d. Bit line 120d is electrically coupled to contacts and phase change elements 202d. Contacts and phase change elements 202d include second phase change element 128c and a first phase change element 126. Contacts and phase change elements 202d are electrically coupled to collector/emitter region 206d. Collector/emitter regions 206c and 206d and base region 208d form bipolar transistor 124c. Word line 122a is electrically coupled to base region 208e through word line contact 204e.

Bit lines 120a-120d are formed below word line 122a. Each bit line 120a-120d and each contact and phase change element 202a-202d is laterally surrounded by dielectric material 214 to electrically isolate them from word line contacts 204a-204e. Each collector/emitter region 206 is formed adjacent to and between two base regions 208. For example, collector/emitter region 206b is formed adjacent to and between base region 208b and base region 208c. In this embodiment, a SOI fabrication technique is used. Isolation region 210 isolates collector/emitter regions 206a-206d from each other and from substrate 212. Isolation region 210 also isolates base regions 208a-208e from each other and from substrate 212.

Figure 5D:
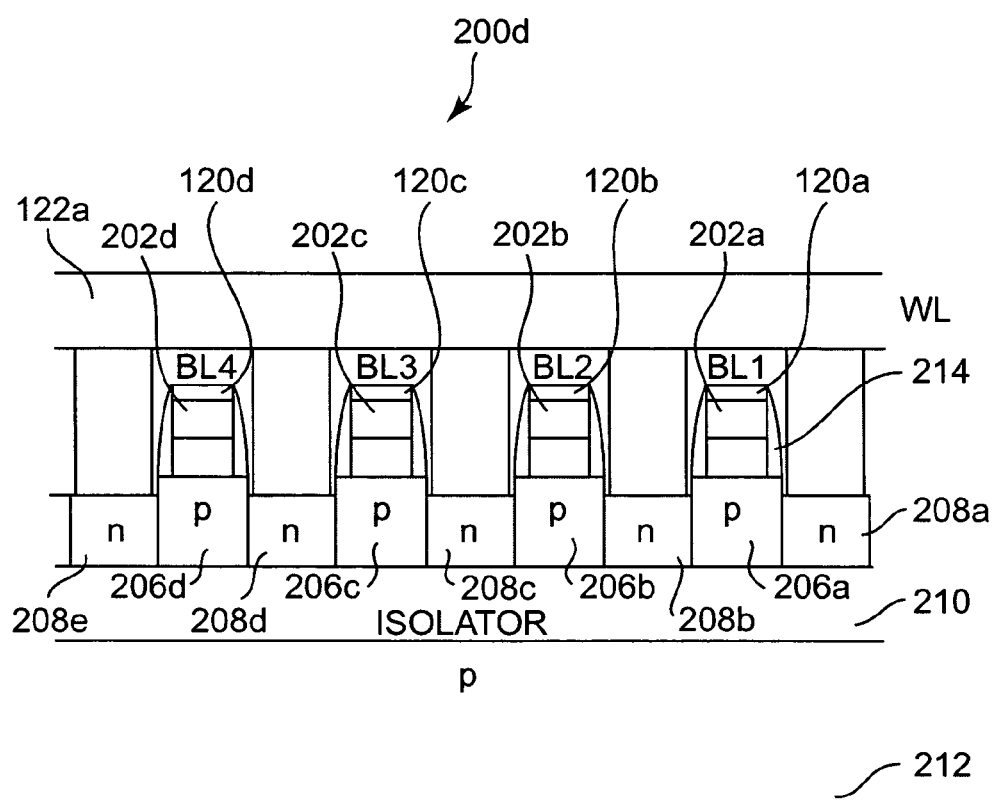
FIG. 5D is a simplified cross-sectional view illustrating another embodiment of the phase change memory array illustrated in FIG. 4.

FIG. 5D a simplified cross-sectional view illustrating another embodiment 200d of phase change memory array 110a previously described and illustrated with reference to FIG. 4. Embodiment 200d is similar to embodiment 200c previously described and illustrated with reference to FIG. 5C, except that in embodiment 200d the npn transistors are replaced with pnp transistors. Collector/emitter regions 206a-206d are p-type and base regions 208a-208e are n-type.

Figure 6:
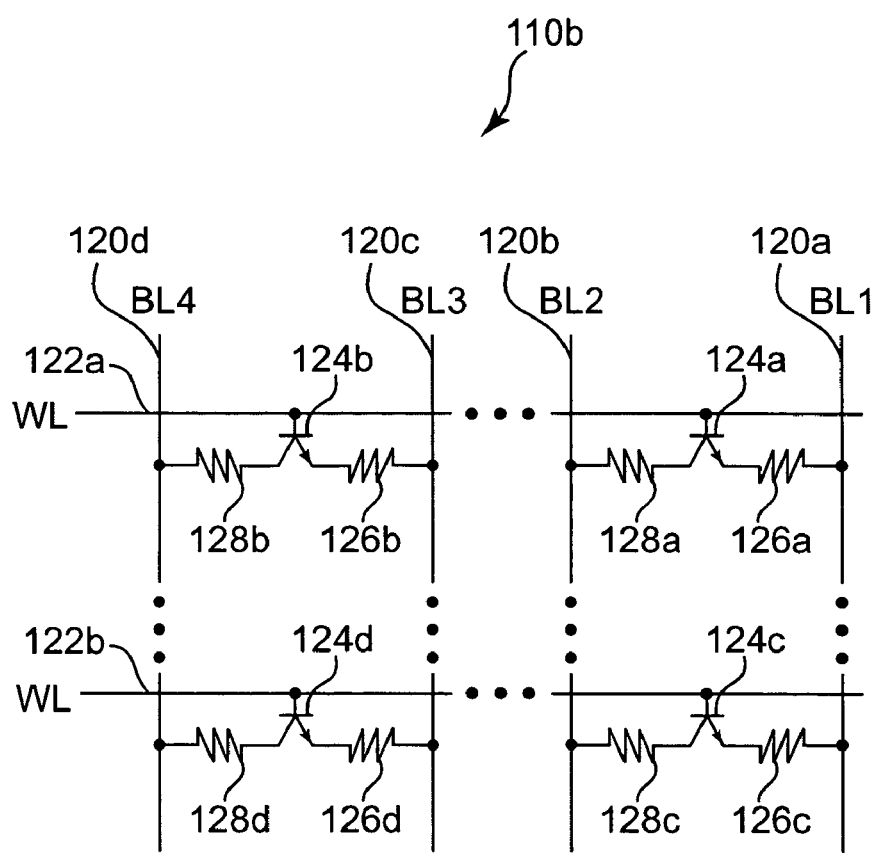
FIG. 6 is a schematic diagram illustrating another embodiment of a phase change memory array.

FIG. 6 is a schematic diagram illustrating another embodiment of a phase change memory array 110b. In one embodiment, memory array 110 is similar to memory array 110b. Memory array 110b includes bit lines 120a-120d, word lines 122a-122b, bipolar transistors 124a-124d, first phase change elements 126a-126d, and second phase change elements 128a-128d. Each bit line 120 is electrically coupled to a plurality of phase change elements 126 or 128. Each bipolar transistor 124 is electrically coupled to a first phase change element 126, a second phase change element 128, and a word line 122.

Bit line 120a is electrically coupled to one side of first phase change element 126a. The other side of first phase change element 126a is electrically coupled to the emitter of bipolar transistor 124a. The base of bipolar transistor 124a is electrically coupled to word line 122a. The collector of bipolar transistor 124a is electrically coupled to one side of second phase change element 128a. The other side of second phase change element 128a is electrically coupled to bit line 120b.

Bit line 120c is electrically coupled to one side of first phase change element 126b. The other side of first phase change element 126b is electrically coupled to the emitter of bipolar transistor 124b. The base of bipolar transistor 124b is electrically coupled to word line 122a. The collector of bipolar transistor 124b is electrically coupled to one side of second phase change element 128b. The other side of second phase change element 128b is electrically coupled to bit line 120d.

Bit line 120a is electrically coupled to one side of first phase change element 126c. The other side of first phase change element 126c is electrically coupled to the emitter of bipolar transistor 124c. The base of bipolar transistor 124c is electrically coupled to word line 122b. The collector of bipolar transistor 124c is electrically coupled to one side of second phase change element 128c. The other side of second phase change element 128c is electrically coupled to bit line 120b.

Bit line 120c is electrically coupled to one side of first phase change element 126d. The other side of first phase change element 126d is electrically coupled to the emitter of bipolar transistor 124d. The base of bipolar transistor 124d is electrically coupled to word line 122b. The collector of bipolar transistor 124d is electrically coupled to one side of second phase change element 128d. The other side of second phase change element 128d is electrically coupled to bit line 120d.

In another embodiment, each first phase change element 126 is electrically coupled to a collector of a bipolar transistor 124 and each second phase change element 128 is electrically coupled to an emitter of a bipolar transistor 124. While in the illustrated embodiment bipolar transistors 124 are npn transistors, in other embodiments bipolar transistors 124 are pnp transistors.

In this embodiment, each bipolar transistor 124 is used to access one first phase change element 126 and one second phase change element 128 as previously described and illustrated with reference to memory array portion 112 in FIG. 1. Phase change memory array 110b operates similarly to memory array 110.

Figure 7A:
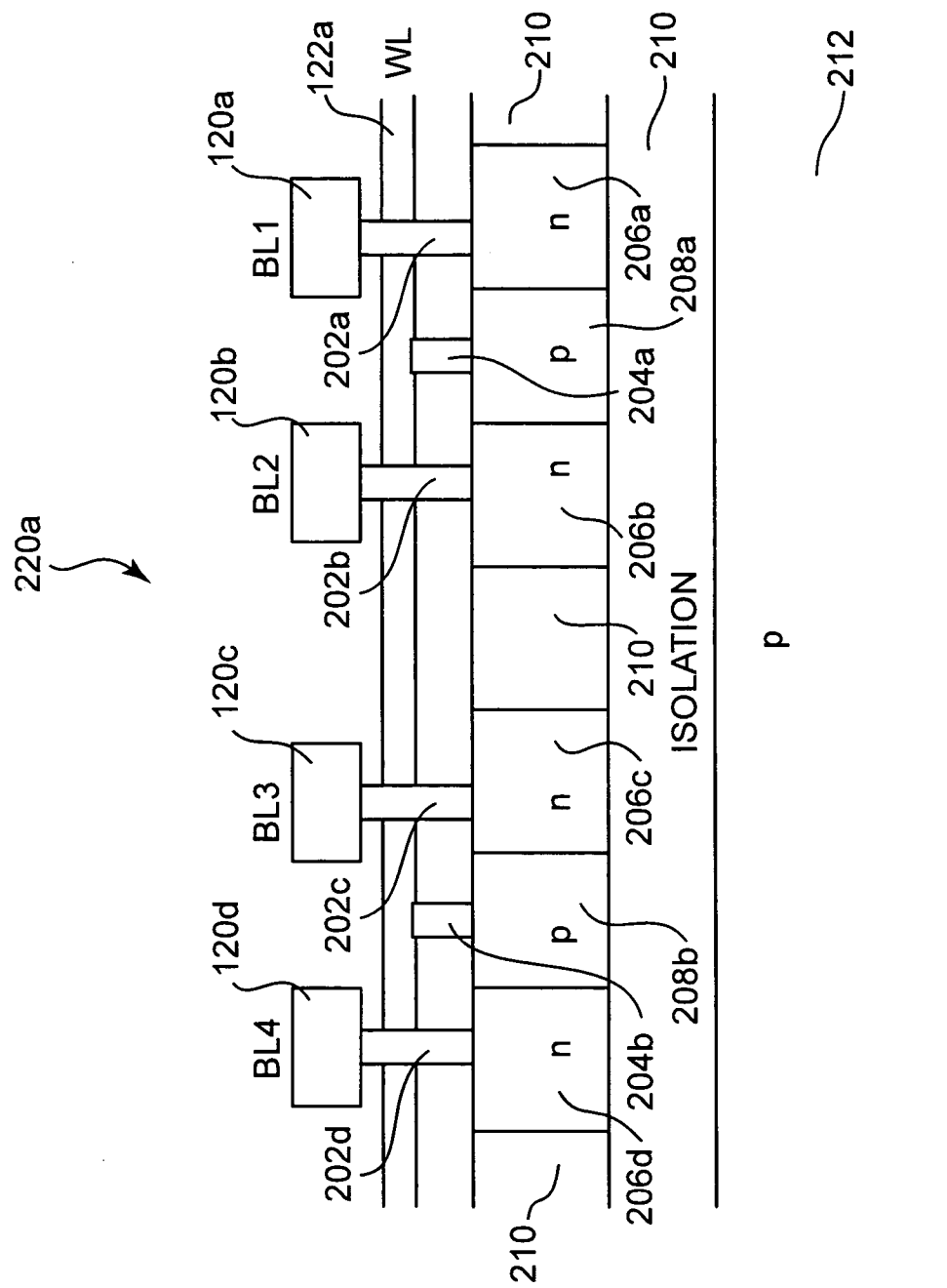
FIG. 7A is a simplified cross-sectional view illustrating one embodiment of the phase change memory array illustrated in FIG. 6.

FIG. 7A is a simplified cross-sectional view illustrating one embodiment 220a of phase change memory array 110b previously described and illustrated with reference to FIG. 6. Embodiment 220a includes bit lines 120a-120d, word line 122a, word line contacts 204a-204b, contacts and phase change elements 202a-202d, n-type collector/emitter regions 206a-206d of bipolar transistors 124, p-type base regions 208a-208b of bipolar transistors 124, isolation regions 210, and p-type substrate 212. In this embodiment, each bipolar transistor 124 is an npn transistor.

Bit line 120a is electrically coupled to contacts and phase change element 202a. Contacts and phase change element 202a include first phase change element 126a. Contacts and phase change element 202a are electrically coupled to collector/emitter region 206a. Word line 122a is electrically coupled to base region 208a through word line contact 204a. Bit line 120b is electrically coupled to contacts and phase change element 202b. Contacts and phase change element 202b include second phase change element 128a. Contacts and phase change element 202b are electrically coupled to collector/emitter region 206b. Collector/emitter regions 206a and 206b and base region 208a form transistor 124a.

Bit line 120c is electrically coupled to contacts and phase change element 202c. Contacts and phase change element 202c include first phase change element 126b. Contacts and phase change element 202c are electrically coupled to collector/emitter region 206c. Word line 122a is electrically coupled to base region 208b through word line contact 204b. Bit line 120d is electrically coupled to contacts and phase change element 202d. Contacts and phase change element 202d include second phase change element 128b. Contacts and phase change element 202d are electrically coupled to collector/emitter region 206d. Collector/emitter regions 206c and 206d and base region 208b form transistor 124b.

Bit lines 120a-120d are formed above word line 122a. Each base region 208 is formed adjacent to and between two collector/emitter regions 206. For example, base region 208a is formed adjacent to and between collector/emitter region 206a and collector/emitter region 206b. In this embodiment, a SOI fabrication technique and shallow trench isolation (STI) is used. Isolation regions 210 isolate collector/emitter regions 206a-206c from each other and from substrate 212. Isolation regions 210 also isolate base regions 208a and 208b from each other and from substrate 212.

Figure 7B:
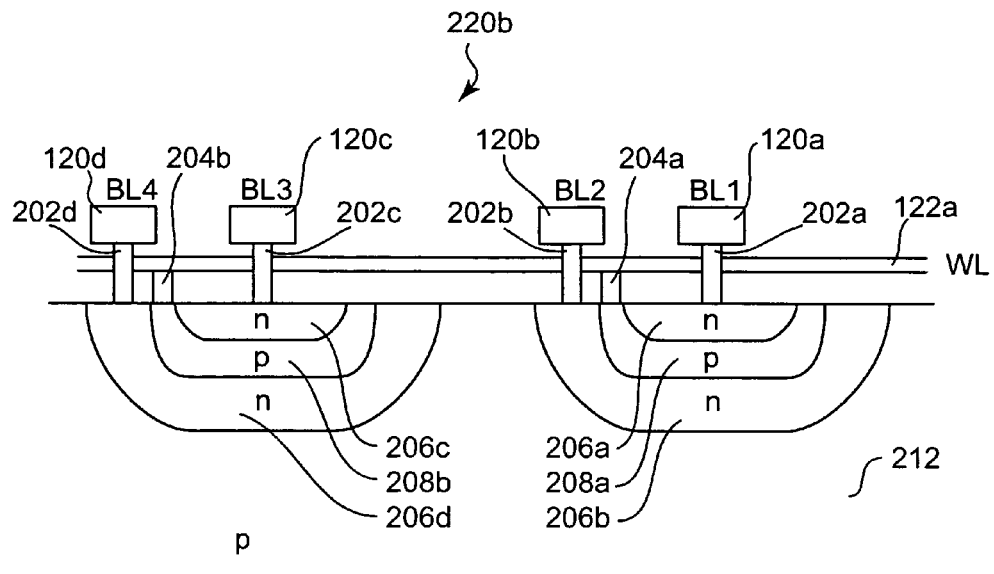
FIG. 7B is a simplified cross-sectional view illustrating another embodiment of the phase change memory array illustrated in FIG. 6.

FIG. 7B is a simplified cross-sectional view illustrating another embodiment 220b of phase change memory array 110b previously described and illustrated with reference to FIG. 6. Embodiment 220b includes bit lines 120a-120d, word line 122a, word line contacts 204a-204b, contacts and phase change elements 202a-202d, n-type collector/emitter regions 206a-206d of bipolar transistors 124, p-type base regions 208a-208b of bipolar transistors 124, and p-type substrate 212. In this embodiment, each bipolar transistor 124 is an npn transistor. Bit lines 120a-120d, word line 122a, word line contacts 204a-204b, contacts and phase change elements 202a-202d, collector/emitter regions 206a-206d, and base regions 208a-208b are electrically coupled as previously described and illustrated with reference to FIG. 7A.

Bit lines 120a-120d are formed above word line 122a. Collector/emitter region 206a is formed directly above and is surrounded by base region 208a. Base region 208a is formed directly above and is surrounded by collector/emitter region 206b. Collector/emitter region 206c is formed directly above and is surrounded by base region 208b. Base region 208b is formed directly above and is surrounded by collector/emitter region 206d. In this embodiment, junction isolation is used. Substrate 212 isolates collector/emitter region 206b from collector/emitter region 206d.

Figure 7C:
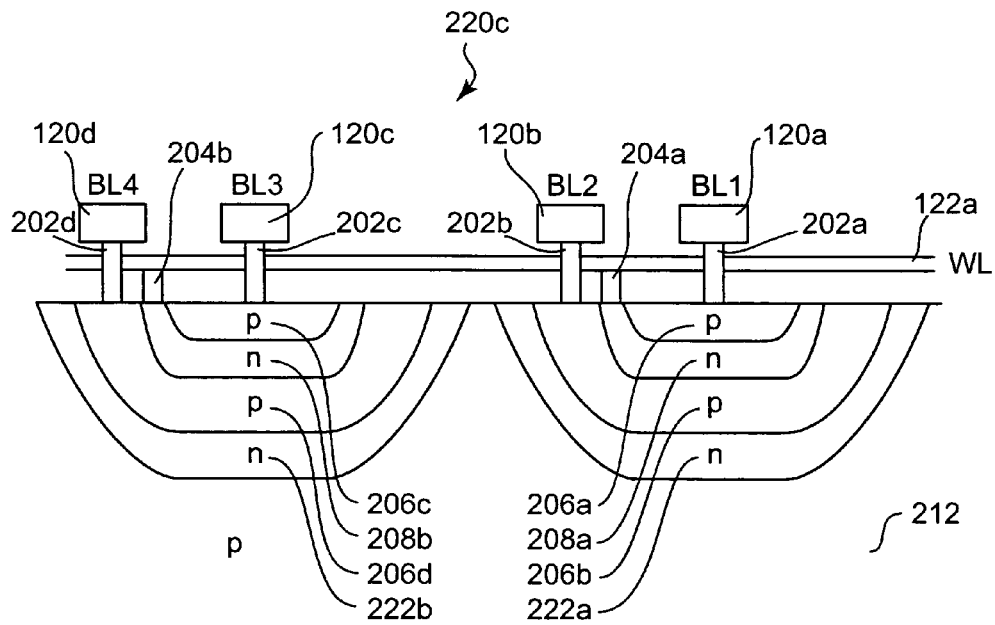
FIG. 7C is a simplified cross-sectional view illustrating another embodiment of the phase change memory array illustrated in FIG. 6.

FIG. 7C is a simplified cross-sectional view illustrating another embodiment 220c of phase change memory array 110b previously described and illustrated with reference to FIG. 6. Embodiment 220c is similar to embodiment 220b previously described and illustrated with reference to FIG. 7B, except that in embodiment 220c the npn transistors are replaced with pnp transistors. Collector/emitter regions 206a-206d are p-type and base regions 208a and 208b are n-type. Collector/emitter region 206b is formed directly above and is surrounded by an n-type region 222a. Collector/emitter region 206d is formed directly above and is surrounded by an n-type region 222b. Regions 222a and 222b isolate collector/emitter regions 206b and 206d from substrate 212.

Figure 7D:
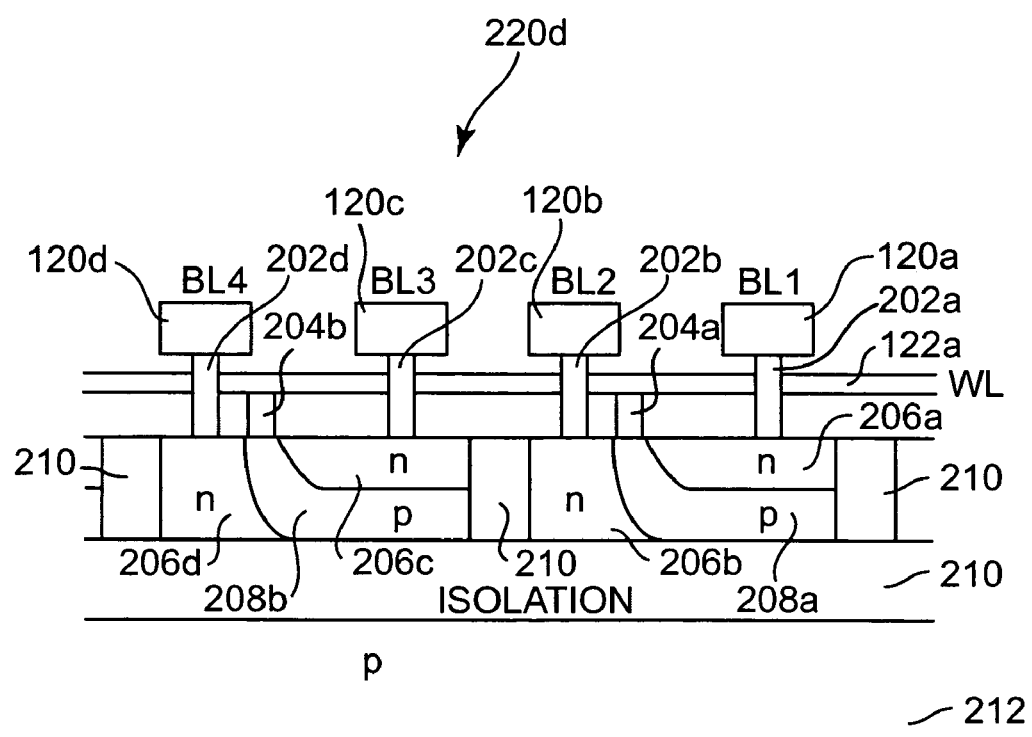
FIG. 7D is a simplified cross-sectional view illustrating another embodiment of the phase change memory array illustrated in FIG. 6.

FIG. 7D is a simplified cross-sectional view illustrating another embodiment 220d of phase change memory array 110b previously described and illustrated with reference to FIG. 6. Embodiment 220d includes bit lines 120a-120d, word line 122a, word line contacts 204a-204b, contacts and phase change elements 202a-202d, n-type collector/emitter regions 206a-206d of bipolar transistors 124, p-type base regions 208a-208b of bipolar transistors 124, isolation regions 210, and p-type substrate 212. In this embodiment, each bipolar transistor 124 is an npn transistor. Bit lines 120a-120d, word line 122a, word line contacts 204a-204b, contacts and phase change elements 202a-202d, collector/emitter regions 206a-206d, and base regions 208a-208b are electrically coupled as previously described and illustrated with reference to FIG. 7A.

Bit lines 120a-120d are formed above word line 122a. In this embodiment, a SOI fabrication technique and STI is used. Collector/emitter region 206a is formed directly above and is surrounded on one side by base region 208a and on another side by an isolation region 210. Base region 208a is adjacent to collector/emitter region 206b on one side and is adjacent to an isolation region 210 on another side. Collector/emitter region 206c is formed directly above and is surrounded on one side by base region 208*b* and on another side by an isolation region 210. Base region 208*b* is adjacent to collector/emitter region 206*d* on one side and is adjacent to an isolation region 210 on another side. Collector/emitter region 206*b* is formed adjacent to and between base region 208*a* and an isolation region 210. Collector/emitter region 206*d* is formed adjacent to and between base region 208*b* and an isolation region 210. An isolation region 210 also isolates collector/emitter regions 206*a* and 206*d* from each other and from substrate 212 and base regions 208*a* and 208*b* from each other and from substrate 212.

Figure 8:
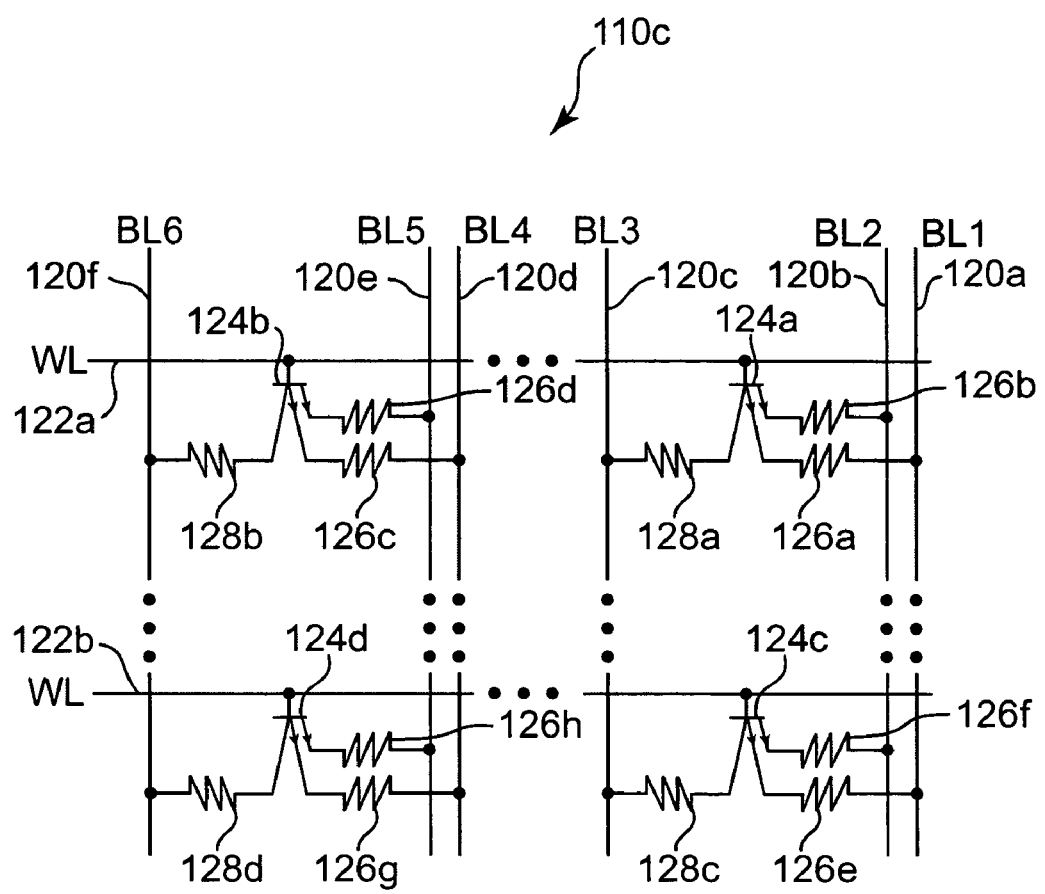
FIG. 8 is a schematic diagram illustrating another embodiment of a phase change memory array.

FIG. 8 is a schematic diagram illustrating another embodiment of a phase change memory array 110*c*. In one embodiment, memory array 110 is similar to memory array 110*c*. Memory array 110*c* includes bit lines 120*a*-120*f*, word lines 122*a*-122*b*, bipolar transistors 124*a*-124*d*, first phase change elements 126*a*-126*h*, and second phase change elements 128*a*-128*d*. Each bit line 120 is electrically coupled to a plurality phase change elements 126 or 128. Each bipolar transistor 124 is electrically coupled to a first phase change element 126, a second phase change element 128, and a word line 122. Each bipolar transistor 124 includes a shared base and a shared emitter for individually accessing three phase change elements.

Bit line 120*a* is electrically coupled to one side of first phase change element 126*a*. Bit line 120*b* is electrically coupled to one side of first phase change element 126*b*. The other side of first phase change element 126*a* and the other side of second phase change element 126*b* are electrically coupled to the shared emitter of bipolar transistor 124*a*. The base of bipolar transistor 124*a* is electrically coupled to word line 122*a*. The collector of bipolar transistor 124*a* is electrically coupled to one side of second phase change element 128*a*. The other side of second phase change element 128*a* is electrically coupled to bit line 120*c*.

Bit line 120*d* is electrically coupled to one side of first phase change element 126*c*. Bit line 120*e* is electrically coupled to one side of first phase change element 126*d*. The other side of first phase change element 126*c* and the other side of first phase change element 126*d* are electrically coupled to the shared emitter of bipolar transistor 124*b*. The base of bipolar transistor 124*b* is electrically coupled to word line 122*a*. The collector of bipolar transistor 124*b* is electrically coupled to one side of second phase change element 128*b*. The other side of second phase change element 128*b* is electrically coupled to bit line 120*f*.

Bit line 120*a* is electrically coupled to one side of first phase change element 126*e*. Bit line 120*b* is electrically coupled to one side of first phase change element 126*f*. The other side of first phase change element 126*e* and the other side of first phase change element 126*f* are electrically coupled to the shared emitter of bipolar transistor 124*c*. The base of bipolar transistor 124*c* is electrically coupled to word line 122*b*. The collector of bipolar transistor 124*c* is electrically coupled to one side of second phase change element 128*c*. The other side of second phase change element 128*c* is electrically coupled to bit line 120*c*.

Bit line 120*d* is electrically coupled to one side of first phase change element 126*g*. Bit line 120*e* is electrically coupled to one side of first phase change element 126*h*. The other side of first phase change element 126*g* and the other side of first phase change element 126*h* are electrically coupled to the shared emitter of bipolar transistor 124*d*. The base of bipolar transistor 124*d* is electrically coupled to word line 122*b*. The collector of bipolar transistor 124*d* is electrically coupled to one side of second phase change element 128*d*. The other side of second phase change element 128*d* is electrically coupled to bit line 120*f*.

In another embodiment, each first phase change element 126 is electrically coupled to a shared collector of a bipolar transistor 124 and each second phase change element 128 is electrically coupled to an emitter of a bipolar transistor 124. While in the illustrated embodiment bipolar transistors 124 are npn transistors, in other embodiments bipolar transistors 124 are pnp transistors.

In this embodiment, each shared bipolar transistor 124 is used to access two first phase change elements 126 and one second phase change element 128. Each phase change element is accessed as previously described and illustrated with reference to memory array portion 112 in FIG. 1. Phase change memory array 110*c* operates similarly to memory array 110.

Figure 9:
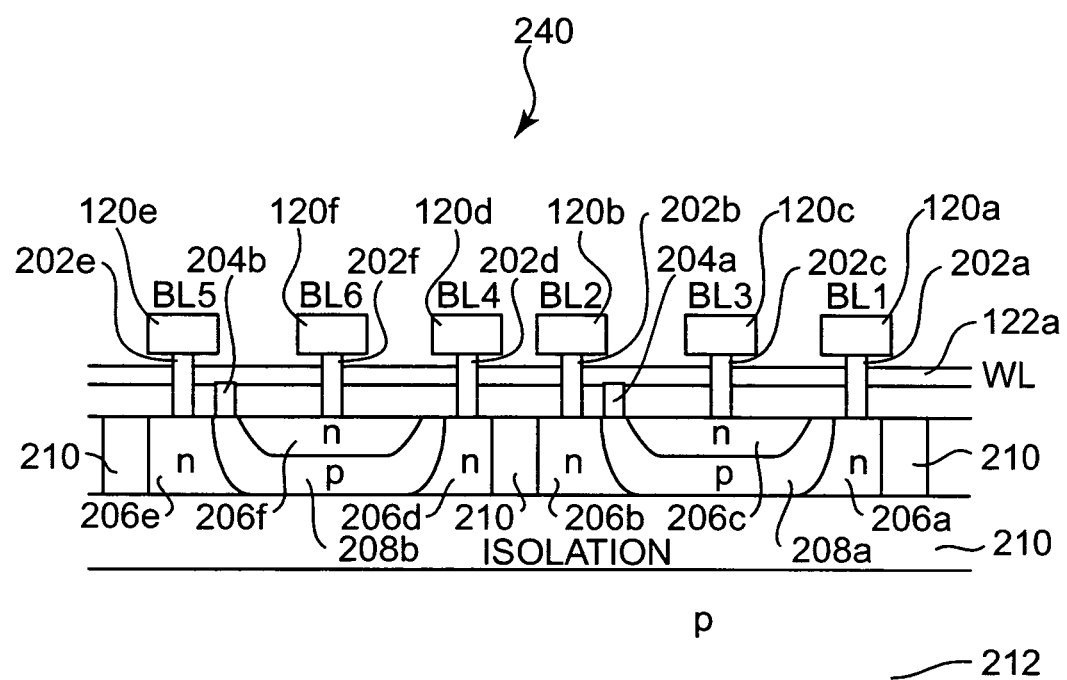
FIG. 9 is a simplified cross-sectional view illustrating one embodiment of the phase change memory array illustrated in FIG. 8.

FIG. 9 is a simplified cross-sectional view illustrating one embodiment 240 of phase change memory array 110*c* previously described and illustrated with reference to FIG. 8. Embodiment 240 includes bit lines 120*a*-120*f*, word line 122*a*, word line contacts 204*a*-204*b*, contacts and phase change elements 202*a*-202*f*, n-type collector/emitter regions 206*a*-206*f* of bipolar transistors 124, p-type base regions 208*a*-208*b* of bipolar transistors 124, isolation regions 210, and p-type substrate 212. In this embodiment, each bipolar transistor 124 is an npn transistor and shares a common base region 208.

Bit line 120*a* is electrically coupled to contacts and phase change element 202*a*. Contacts and phase change element 202*a* include first phase change element 126*a*. Contacts and phase change element 202*a* are electrically coupled to collector/emitter region 206*a*. Bit line 120*c* is electrically coupled to contacts and phase change element 202*c*. Contacts and phase change element 202*c* include second phase change element 128*a*. Contacts and phase change element 202*c* are electrically coupled to collector/emitter region 206*c*. Word line 122*a* is electrically coupled to base region 208*a* through word line contact 204*a*. Collector/emitter regions 206*a* and 206*c* and base region 208*a* form a bipolar transistor 124*a*.

Bit line 120*b* is electrically coupled to contacts and phase change element 202*b*. Contacts and phase change element 202*b* include first phase change element 126*b*. Contacts and phase change element 202*b* are electrically coupled to collector/emitter region 206*b*. Collector/emitter regions 206*b* and 206*c* and base region 208*a* form a bipolar transistor 124*a*.

Bit line 120*d* is electrically coupled to contacts and phase change element 202*d*. Contacts and phase change element 202*d* include first phase change element 126*c*. Contacts and phase change element 202*d* are electrically coupled to collector/emitter region 206*d*. Bit line 120*f* is electrically coupled to contacts and phase change element 202*f*. Contacts and phase change element 202*f* include second phase change element 128*b*. Contacts and phase change element 202*f* are electrically coupled to collector/emitter region 206*f*. Word line 122*a* is electrically coupled to base region 208*b* through word line contact 204*b*. Collector/emitter regions 206*d* and 206*f* and base region 208*b* form a bipolar transistor 124*b*.

Bit line 120*e* is electrically coupled to contacts and phase change element 202*e*. Contacts and phase change element 202*e* include first phase change element 126*d*. Contacts and phase change element 202*e* are electrically coupled to collector/emitter region 206*e*. Collector/emitter regions 206*e* and 206*f* and base region 208*b* form a bipolar transistor 124*b*.

Bit lines 120*a*-120*f* are formed above word line 122*a*. In this embodiment, a SOI fabrication technique and STI is used. Collector/emitter region 206*c* is formed directly above and is surrounded by base region 208*a*. Collector/emitter region 206a is formed adjacent to and between base region 208a and an isolation region 210. Collector/emitter region 206b is formed adjacent to and between base region 208a and an isolation region 210. Collector/emitter region 206f is formed directly above and is surrounded by base region 208b. Collector/emitter region 206d is formed adjacent to and between base region 208b and an isolation region 210. Collector/emitter region 206e is formed adjacent to and between base region 208b and an isolation region 210. An isolation region 210 also isolates collector/emitter regions 206a, 206b, 206d, and 206e from each other and from substrate 212 and base regions 208a and 208b from each other and from substrate 212.

Figure 10:
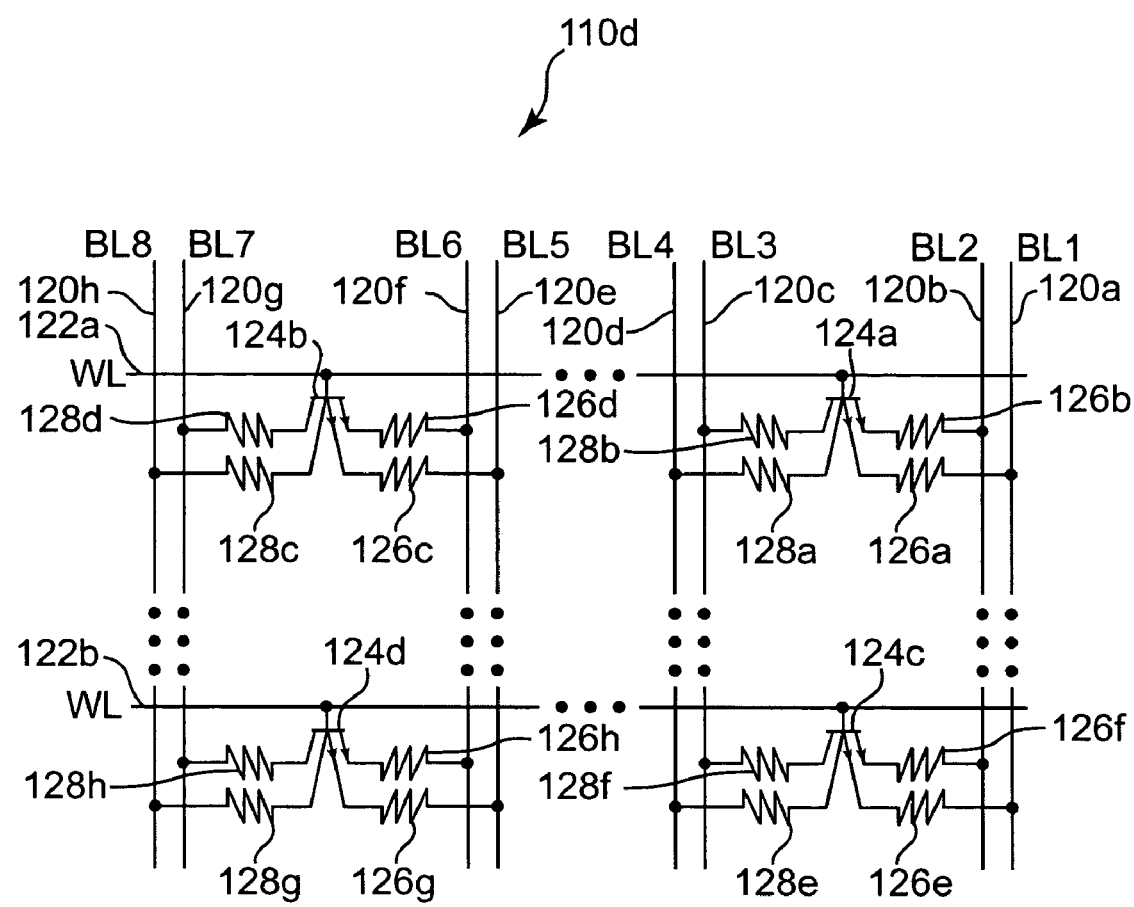
FIG. 10 is a schematic diagram illustrating another embodiment of a phase change memory array.

FIG. 10 is a schematic diagram illustrating another embodiment of a phase change memory array 110d. In one embodiment, memory array 110 is similar to memory array 110d. Memory array 110d includes bit lines 120a-120h, word lines 122a-122b, bipolar transistors 124a-124d, first phase change elements 126a-126h, and second phase change elements 128a-128h. Each bit line 120 is electrically coupled to a plurality of phase change elements 126 or 128. Each bipolar transistor 124 is electrically coupled to a first phase change element 126, a second phase change element 128, and a word line 122. Each bipolar transistor 124 includes a shared base, a shared emitter, and a shared collector for individually accessing four phase change elements.

Bit line 120a is electrically coupled to one side of first phase change element 126a. Bit line 120b is electrically coupled to one side of first phase change element 126b. The other side of first phase change element 126a and the other side of first phase change element 126b are electrically coupled to the shared emitter of bipolar transistor 124a. The base of bipolar transistor 124a is electrically coupled to word line 122a. The shared collector of bipolar transistor 124a is electrically coupled to one side of second phase change element 128a and one side of second phase change element 128b. The other side of second phase change element 128a is electrically coupled to bit line 120d. The other side of second phase change element 128b is electrically coupled to bit line 120c.

Bit line 120e is electrically coupled to one side of first phase change element 126c. Bit line 120f is electrically coupled to one side of first phase change element 126d. The other side of first phase change element 126c and the other side of first phase change element 126d are electrically coupled to the shared emitter of bipolar transistor 124b. The base of bipolar transistor 124b is electrically coupled to word line 122a. The shared collector of bipolar transistor 124b is electrically coupled to one side of second phase change element 128c and one side of second phase change element 128d. The other side of second phase change element 128c is electrically coupled to bit line 120h. The other side of second phase change element 128d is electrically coupled to bit line 120g.

Bit line 120a is electrically coupled to one side of first phase change element 126e. Bit line 120b is electrically coupled to one side of first phase change element 126f. The other side of first phase change element 126e and the other side of first phase change element 126f are electrically coupled to the shared emitter of bipolar transistor 124c. The base of bipolar transistor 124c is electrically coupled to word line 122b. The shared collector of bipolar transistor 124c is electrically coupled to one side of second phase change element 128e and one side of second phase change element 128f. The other side of second phase change element 128e is electrically coupled to bit line 120d. The other side of second phase change element 128f is electrically coupled to bit line 120c.

Bit line 120e is electrically coupled to one side of first phase change element 126g. Bit line 120f is electrically coupled to one side of first phase change element 126h. The other side of first phase change element 126g and the other side of first phase change element 126h are electrically coupled to the shared emitter of bipolar transistor 124d. The base of bipolar transistor 124d is electrically coupled to word line 122b. The shared collector of bipolar transistor 124d is electrically coupled to one side of second phase change element 128g and one side of second phase change element 128h. The other side of second phase change element 128g is electrically coupled to bit line 120h. The other side of second phase change element 128h is electrically coupled to bit line 120g.

In another embodiment, each first phase change element 126 is electrically coupled to a shared collector of a bipolar transistor 124 and each second phase change element 128 is electrically coupled to a shared emitter of a bipolar transistor 124. While in the illustrated embodiment bipolar transistors 124 are npn transistors, in other embodiments bipolar transistors 124 are pnp transistors.

In this embodiment, each shared bipolar transistor 124 is used to access two first phase change elements 126 and two second phase change elements 128. Each phase change element is accessed as previously described and illustrated with reference to memory array portion 112 in FIG. 1. Phase change memory array 110d operates similarly to memory array 110.

Figure 11A:
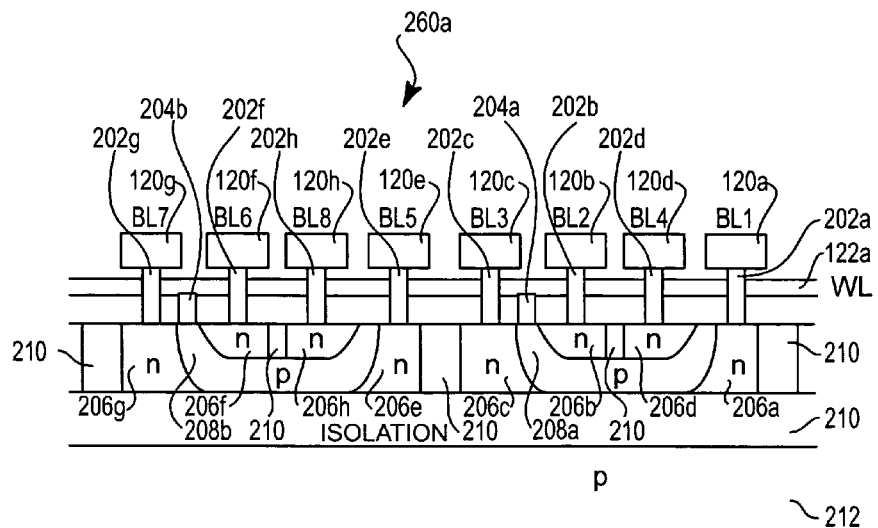
FIG. 11A is a simplified cross-sectional view illustrating one embodiment of the phase change memory array illustrated in FIG. 10.

FIG. 11A is a simplified cross-sectional view illustrating one embodiment 260a of phase change memory array 110d previously described and illustrated with reference to FIG. 10. Embodiment 260a includes bit lines 120a-120h, word line 122a, word line contacts 204a-204b, contacts and phase change elements 202a-202h, n-type collector/emitter regions 206a-206h of bipolar transistors 124, p-type base regions 208a-208b of bipolar transistors 124, isolation regions 210, and p-type substrate 212. In this embodiment, each bipolar transistor 124 is an npn transistor and shares a common base region 208.

Bit line 120a is electrically coupled to contacts and phase change element 202a. Contacts and phase change element 202a include first phase change element 126a. Contacts and phase change element 202a are electrically coupled to collector/emitter region 206a. Bit line 120d is electrically coupled to contacts and phase change element 202d. Contacts and phase change element 202d include second phase change element 128a. Contacts and phase change element 202d are electrically coupled to collector/emitter region 206d. Bit line 120b is electrically coupled to contacts and phase change element 202b. Contacts and phase change element 202b include first phase change element 126b. Contacts and phase change element 202b are electrically coupled to collector/emitter region 206b. Word line 122a is electrically coupled to base region 208a through word line contact 204a. Bit line 120c is electrically coupled to contacts and phase change element 202c. Contacts and phase change element 202c include second phase change element 128b. Contacts and phase change element 202c are electrically coupled to collector/emitter region 206c. Collector/emitter regions 206a and 206d and base region 208a form a bipolar transistor 124a. Collector/emitter regions 206b and 206c and base region 208a form a bipolar transistor 124a.

Bit line 120e is electrically coupled to contacts and phase change element 202e. Contacts and phase change element 202e include first phase change element 126c. Contacts and phase change element 202e are electrically coupled to collector/emitter region 206e. Bit line 120h is electrically coupled to contacts and phase change element 202h. Contacts and phase change element 202h include second phase change element 128c. Contacts and phase change element 202h are electrically coupled to collector/emitter region 206h. Bit line 120f is electrically coupled to contacts and phase change element 202f. Contacts and phase change element 202f include first phase change element 126d. Contacts and phase change element 202f are electrically coupled to collector/emitter region 206f. Word line 122a is electrically coupled to base region 208b through word line contact 204b. Bit line 120g is electrically coupled to contacts and phase change element 202g. Contacts and phase change element 202g include second phase change element 128d. Contacts and phase change element 202g are electrically coupled to collector/emitter region 206g. Collector/emitter regions 206e and 206h and base region 208b form a bipolar transistor 124b. Collector/emitter regions 206f and 206g and base region 208b form a bipolar transistor 124b.

Bit lines 120a-120h are formed above word line 122a. In this embodiment, a SOI fabrication technique and STI is used. Collector/emitter region 206b is isolated from collector/emitter region 206d by an isolation region 210. Collector/emitter regions 206b and 206d are formed directly above and are surrounded by base region 208a. Collector/emitter region 206a is formed adjacent to and between base region 208a and an isolation region 210. Collector/emitter region 206c is formed adjacent to and between base region 208a and an isolation region 210.

Collector/emitter region 206f is isolated from collector/emitter region 206h by an isolation region 210. Collector/emitter regions 206f and 206h are formed directly above and are surrounded by base region 208b. Collector/emitter region 206e is formed adjacent to and between base region 208b and an isolation region 210. Collector/emitter region 206g is formed adjacent to and between base region 208b and an isolation region 210. An isolation region 210 also isolates collector/emitter regions 206a, 206c, 206e, and 206g from each other and from substrate 212 and base regions 208a and 208b from each other and from substrate 212.

Figure 11B:
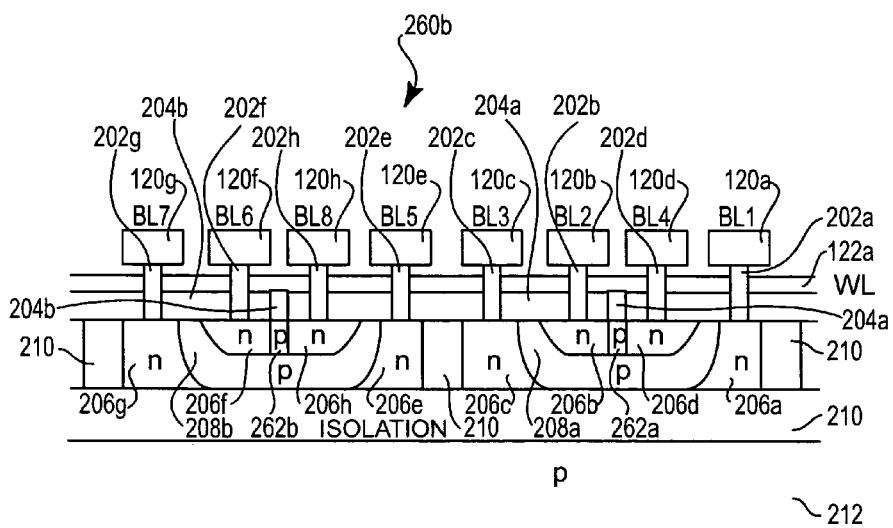
FIG. 11B a simplified cross-sectional view illustrating another embodiment of the phase change memory array illustrated in FIG. 10.

FIG. 11B is a simplified cross-sectional view illustrating another embodiment 260b of phase change memory array 110d previously described and illustrated with reference to FIG. 10. Embodiment 260b includes bit lines 120a-120h, word line 122a, word line contacts 204a-204b, contacts and phase change elements 202a-202h, n-type collector/emitter regions 206a-206h of bipolar transistors 124, p-type base regions 208a-208b of bipolar transistors 124, isolation regions 210, and p-type substrate 212. Embodiment 260b is similar to embodiment 260a previously described and illustrated with reference to FIG. 11A, except that in embodiment 260b word line 122a is electrically coupled to base region 208a through word line contact 204a and p-type contact region 262a and to base region 208b through word line contact 204b and p-type contact region 262b. Contact region 262a isolates collector/emitter region 206b from collector/emitter region 206d. Contact region 262b isolates collector/emitter region 206f from collector/emitter region 206h.

Embodiments of the present invention provide a phase change memory using bipolar transistors that each access two phase change elements. By controlling the biasing of each bipolar transistor through the word lines and bit lines, each phase change element can be programmed individually and read individually without affecting the other phase change elements. In this way, the density of the phase change memory can be increased. While the specific embodiments described herein substantially focused on using phase change memory elements, the present invention can be applied to any suitable type of resistive memory elements including unipolar memory elements, such as binary oxide resistive memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a first bipolar transistor;
   a first bit line;
   a first resistive memory element coupled between a collector of the first bipolar transistor and the first bit line;
   a second bit line;
   a second resistive memory element coupled between an emitter of the first bipolar transistor and the second bit line;
   a second bipolar transistor;
   a third resistive memory element coupled between one of a collector and an emitter of the second bipolar transistor and the second bit line; and
   a word line coupled to a base of the first bipolar transistor and a base of the second bipolar transistor.

2. The integrated circuit of claim 1, wherein the first resistive memory element comprises a first phase change element, and wherein the second resistive memory element comprises a second phase change element.

3. The integrated circuit of claim 1, wherein the first resistive memory element comprises a first unipolar memory element, and wherein the second resistive memory element comprises a second unipolar memory element.

4. The integrated circuit of claim 1, further comprising:
   a circuit for reading a state of the first resistive memory element by biasing the first bipolar transistor such that a read current is generated through the first resistive memory element.

5. The integrated circuit of claim 1, further comprising:
   a circuit for reading a state of the second resistive memory element by biasing the first bipolar transistor such that a read current is generated through the second resistive memory element.

6. The integrated circuit of claim 1, further comprising:
   a circuit for programming the first resistive memory element by biasing the first bipolar transistor such that a write current is generated through the first resistive memory element.

7. The integrated circuit of claim 1, further comprising:
   a circuit for programming the second resistive memory element by biasing the first bipolar transistor such that a write current is generated through the second resistive memory element.

8. The integrated circuit of claim 1, further comprising:
   a third bit line; and
   a fourth resistive memory element coupled between the other one of the collector and the emitter of the second bipolar transistor and the third bit line.

9. An integrated circuit comprising:
   a first bipolar transistor;
   a first bit line;

a first resistive memory element coupled between a collector of the first bipolar transistor and the first bit line;
a second bit line;
a second resistive memory element coupled between an emitter of the first bipolar transistor and the second bit line;
a word line coupled to a base of the first bipolar transistor;
a second bipolar transistor sharing a base, a collector, and an emitter with the first bipolar transistor;
a third bit line;
a third resistive memory element coupled between a collector of the second bipolar transistor and the third bit line;
a fourth bit line; and
a fourth resistive memory element coupled between an emitter of the second bipolar transistor and the fourth bit line.

10. The memory of claim 9, wherein the first resistive memory element comprises a first phase change element, and wherein the second resistive memory element comprises a second phase change element.

11. The memory of claim 9, wherein an adjacent bipolar transistor is isolated from the first bipolar transistor using junction isolation.

12. The memory of claim 9, wherein an adjacent bipolar transistor is isolated from the first bipolar transistor using a shallow trench isolation technique.

13. The memory of claim 9, wherein an adjacent bipolar transistor is isolated from the first bipolar transistor using a silicon on insulator technique.

14. The memory of claim 9, wherein an adjacent bipolar transistor is isolated from the first bipolar transistor using at least two of junction isolation, a shallow trench isolation technique, and a silicon on insulator technique.

15. The memory of claim 9, wherein the collector, the base, and the emitter of the first bipolar transistor are arranged horizontally.

16. The memory of claim 9, wherein the collector, the base, and the emitter of the first bipolar transistor are arranged vertically.

17. The memory of claim 9, wherein the collector, the base, and the emitter of the first bipolar transistor are arranged in a combination of both horizontally and vertically.

18. A memory comprising:
a first bipolar transistor;
a first bit line;
a first resistive memory element coupled between a collector of the first bipolar transistor and the first bit line;
a second bit line;
a second resistive memory element coupled between an emitter of the first bipolar transistor and the second bit line;
a word line coupled to a base of the first bipolar transistor;
a second bipolar transistor sharing a base and one of a collector and an emitter with the first bipolar transistor;
a third bit line; and
a third resistive memory element coupled between the one of the shared collector and emitter of the second bipolar transistor and the third bit line.

19. A memory comprising:
a first bipolar transistor;
a first bit line
a first resistive memory element coupled between a collector of the first bipolar transistor and the first bit line;
a second bit line;
a second resistive memory element coupled between an emitter of the first bipolar transistor and the second bit line;
a second bipolar transistor;
a third resistive memory element coupled between one of a collector and an emitter of the second bipolar transistor and the second bit line;
a word line coupled to a base of the first bipolar transistor and a base of the second bipolar transistor; and
means for individually accessing the first resistive memory element and the second resistive memory element for read and write operations.

20. The memory of claim 19, wherein the first resistive memory element comprises a first phase change element, and wherein the second resistive memory element comprises a second phase change element.

21. The memory of claim 19, wherein the first bipolar transistor comprises a pnp transistor.

22. The memory of claim 19, wherein the first bipolar transistor comprises an npn transistor.

23. The memory of claim 19, wherein the first resistive memory element comprises a multi-bit resistive memory element, and wherein the second resistive memory element comprises a multi-bit resistive memory element.

24. A method for fabricating a memory, the method comprising:
providing a first bipolar transistor;
providing a first bit line;
coupling a first resistive memory element between a collector of the first bipolar transistor and the first bit line;
providing a second bit line;
coupling a second resistive memory element between an emitter of the first bipolar transistor and the second bit line;
providing a second bipolar transistor;
coupling a third resistive memory element between one of a collector and an emitter of the second bipolar transistor and the second bit line; and
coupling a word line to a base of the first bipolar transistor and a base of the second bipolar transistor.

25. The method of claim 24, wherein coupling the first resistive memory element comprises coupling a first phase change element, and wherein coupling the second resistive memory element comprises coupling a second phase change element.

26. The method of claim 24, further comprising:
providing a circuit for reading a state of the first resistive memory element by biasing the first bipolar transistor such that a read current is generated through the first resistive memory element.

27. The method of claim 24, further comprising:
providing a circuit for reading a state of the second resistive memory element by biasing the first bipolar transistor such that a read current is generated through the second resistive memory element.

28. The method of claim 24, further comprising:
providing a circuit for programming the first resistive memory element by biasing the first bipolar transistor such that a write current is generated through the first resistive memory element.

29. The method of claim 24, further comprising:
providing a circuit for programming the second resistive memory element by biasing the first bipolar transistor such that a read current is generated through the second resistive memory element.

30. The method of claim 24, further comprising:
providing a third bit line; and coupling a fourth resistive memory element between the other one of the collector and the emitter of the second bipolar transistor and the third bit line.

31. A method for fabricating a memory, the method comprising:

providing a first bipolar transistor;

providing a first bit line;

coupling a first resistive memory element between a collector of the first bipolar transistor and the first bit line;

providing a second bit line;

coupling a second resistive memory element between an emitter of the first bipolar transistor and the second bit line;

coupling a word line to a base of the first bipolar transistor;

providing a second bipolar transistor sharing a base, a collector, and an emitter with the first bipolar transistor;

providing a third bit line;

coupling a third resistive memory element between a collector of the second bipolar transistor and the third bit line;

providing a fourth bit line; and coupling a fourth resistive memory element between an emitter of the second bipolar transistor and the fourth bit line.

32. A method for fabricating a memory, the method comprising:

providing a first bipolar transistor;

providing a first bit line;

coupling a first resistive memory element between a collector of the first bipolar transistor and the first bit line;

providing a second bit line;

coupling a second resistive memory element between an emitter of the first bipolar transistor and the second bit line;

coupling a word line to a base of the first bipolar transistor;

providing a second bipolar transistor sharing a base and one of a collector and an emitter with the first bipolar transistor;

providing a third bit line; and coupling a third resistive memory element between the one of the shared collector and emitter of the second bipolar transistor and the third bit line.

33. The method of claim 32, wherein coupling the first resistive memory element comprises coupling first phase change element, and wherein coupling second resistive memory element comprises coupling second phase change element.

34. The method of claim 32, wherein providing the first bipolar transistor comprises providing a pnp transistor.

35. The method of claim 32, wherein providing the first bipolar transistor comprises providing an npn transistor.

* * * * *